United States Patent
Seo et al.

(10) Patent No.: US 7,312,121 B2
(45) Date of Patent: Dec. 25, 2007

(54) METHOD OF MANUFACTURING A SEMICONDUCTOR MEMORY DEVICE

(75) Inventors: Jung-woo Seo, Gyeonggi-do (KR); Tae-hyuk Ahn, Gyeonggi-do (KR); Jeong-sic Jeon, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 316 days.

(21) Appl. No.: 11/155,174

(22) Filed: Jun. 16, 2005

(65) Prior Publication Data

US 2005/0233505 A1 Oct. 20, 2005

Related U.S. Application Data

(62) Division of application No. 10/954,835, filed on Sep. 29, 2004, now Pat. No. 6,927,127.

(30) Foreign Application Priority Data

Oct. 9, 2003 (KR) ............................... 2003-70271

(51) Int. Cl.
*H01L 21/8242* (2006.01)

(52) U.S. Cl. ...................... 438/256; 438/399; 438/597; 438/639

(58) Field of Classification Search ................. 438/256, 438/399, 597, 639
See application file for complete search history.

(56) References Cited

U.S. PATENT DOCUMENTS

| 6,458,692 | B1 | 10/2002 | Kim |
| 6,924,229 | B2 * | 8/2005 | Cheong et al. ............. 438/639 |
| 7,153,727 | B2 * | 12/2006 | Lee et al. .................... 438/128 |
| 2004/0099957 | A1 | 5/2004 | Jin |
| 2004/0140486 | A1 | 7/2004 | Lee et al. |

* cited by examiner

*Primary Examiner*—Jack Chen
(74) *Attorney, Agent, or Firm*—Marger Johnson & McCollom, P.C.

(57) ABSTRACT

Manufacturing a semiconductor memory by first forming a first insulating layer covering a conductive pad. Next forming and pattering a bit line conductive layer and a second insulating layer to expose a part of the first insulating layer. A third insulating layer covering the exposed surfaces of the first insulating layer is formed. Exposing an upper surface of the bit line conductive layer pattern and an upper surface of the third insulating layer. Removing part of the third insulating layer and first insulating layer to expose the conductive pad. Forming a spacer on the side walls of the bit line conductive layer pattern and the first insulating layer. An insulating layer pattern and a second spacer layer are respectively formed on the bit line conductive layer pattern and on a side wall of the first spacer and a conductive plug, which is in contact with the conductive pad is formed.

10 Claims, 28 Drawing Sheets

METHOD OF MANUFACTURING A SEMICONDUCTOR MEMORY DEVICE

This application is a Divisional of U.S. Ser. No. 10/954,835, filed on Sep. 29, 2004 now U.S. Pat. No. 6,927,127, now pending, which claims priority from Korean Patent Application No. 2003-70271, filed on Oct. 9, 2003, all of which are hereby incorporated by reference in their entirety.

BACKGROUND OF THE INVENTION

1. Field of the Invention

The present invention relates to a method of manufacturing semiconductor devices, and more particularly, to a method of manufacturing a semiconductor memory devices, such as DRAM (Dynamic Random Access Memory) devices.

2. Description of the Related Art

When semiconductor devices are miniaturized, line width and the intervals between lines are decreased. The decreased line width and the decreased interval between lines necessitates an increase in the resolution of the lithography process used to manufacture the devices. In general, the enhancements being made in alignment techniques is lagging behind the improvements being made in the resolution. As a result, the minimization of misalignment during manufacture is an important area. This is especially important in the manufacture of semiconductor memory devices that including capacitors, such as DRAMs. In order to increase the effective area of capacitors, bit lines are first formed and then the capacitors are formed. After the formation of the bit lines, buried contacts must be formed. The buried contact electrically connect the source/drain regions of transistors with the storage electrodes of the capacitors. To form these buried contacts, narrow and deep buried contact holes must be formed. It is well known that it is difficult to form contact holes having a high aspect ratio using lithography processes.

In order to minimize the aforementioned limitation, a self-aligned contact (SAC) process is widely used. According to the SAC process, a first insulating layer of oxide layer is formed over a buried contact pad which is located on an impurity region of a semiconductor substrate, for instance, on a source/drain region. Afterwards, bit line stacks, spaced apart from each other by a predetermined interval, are disposed on the first insulating layer. These bit line stacks have a structure where hard mask layers, each consisting of a tungsten (W) layer and a nitride layer, are sequentially stacked. A spacer layer composed of nitride is formed on side walls of the bit line stacks. Thereafter, a second insulating layer of oxide layer is formed to cover the bit line stacks and the space layer. After that, a predetermined mask layer pattern is formed on the second insulating layer, and then a part of the second insulating layer and a part of the first insulating layer are sequentially removed by using the mask layer pattern as an etch mask. In this way, a buried contact hole that partly exposes a surface of the buried contact pad is formed. During the etch step, the hard mask layer of the bit line stack and the spacer layer that are exposed by removing a part of the second insulating layer partly act as the etch mask. Thus, the buried contact hole is aligned by the hard mask layer of the bit line stack and the spacer layer.

In forming the buried contact as above, two factors that greatly influence the device characteristics are the need for sufficient: (1) insulation between the tungsten layer of the bit line stack and the buried contact plug filling the buried contact hole, and (2) contact area between the buried contact plug and the buried contact pad. A large contact area between the buried contact plug and the buried contact pad means that the interval between the spacer layers of the bit line stack should be large and consequently the thickness of the spacer layer should be small. Accordingly, it is required that the thickness of the spacer layer and the interval between adjacent spacer layers of the bit line stack be precise. One reason for this is that the oxide layers of the first and second insulating layers and the nitride layers of the hard mask and the spacer layer are etched together during the etch step for the formation of the buried contact hole. Since the etch selectivity between the oxide layer and the nitride layer is not very high, the nitride layer is etched by a predetermined thickness together with the oxide layer. Thus, it is not easy to maintain the remaining nitride at a desired thickness.

SUMMARY OF THE INVENTION

The present invention provides a method of manufacturing semiconductor memory device, which results in a sufficient insulation between a bit line stack and a buried contact plug and a sufficient contact area between the buried contact plug and a buried contact pad.

According to one aspect of the present invention, the method comprises: forming a first insulating layer covering a conductive pad contacting an impurity region of a semiconductor substrate; sequentially forming a bit line conductive layer and a second insulating layer on the first insulating layer; patterning the bit line conductive layer and the second insulating layer to form a bit line conductive layer pattern and a second insulating layer pattern that expose a part of the first insulating layer; forming a third insulating layer covering the exposed surfaces of the first insulating layer, the bit line conductive layer pattern and the second insulating layer pattern; removing a part of the third insulating layer and the second insulating layer pattern to expose an upper surface of the bit line conductive layer pattern and an upper surface of the third insulating layer in parallel with each other; sequentially removing the exposed portion of the third insulating layer and a part of the first insulating layer to expose the conductive pad; forming a first spacer layer on side walls of the bit line conductive layer pattern and the first insulating layer; removing an upper portion of the bit line conductive layer pattern by a predetermined thickness such that an upper portion of the first spacer layer is protruded; respectively forming an insulating layer pattern on the bit line conductive layer pattern and a second spacer layer on a side wall of the first spacer; and forming a conductive plug, which is in contact with the conductive pad between the second spacer layers.

The removal of a part of the third insulating layer and the second insulating layer pattern may be performed by using a chemical mechanical polishing.

The exposing of the conductive pad may comprise: forming a stripe-shaped photoresist layer pattern crossing the bit line conductive layer pattern such that a partial surface of the bit line conductive layer pattern and a partial surface of the third insulating layer are exposed; performing an etch process using the photoresist layer pattern as an etch mask to remove the exposed portion of the third insulating layer such that the conductive pad beneath the third insulating layer is exposed; and removing the photoresist layer pattern.

In the above case, the third insulating layer is formed of a material layer having a high etching selectivity with respect to the bit line conductive layer. Also, the bit line conductive layer is a tungsten (W) layer and the third insulating layer is an oxide layer.

The forming of the first spacer layer may comprise: forming a first spacer insulating layer on an entire surface of a resultant semiconductor substrate where the conductive pad is exposed; and removing the first spacer insulating layer placed on the bit line conductive layer pattern and the conductive pad to expose the upper surface of the bit line conductive layer pattern and the upper surface of the conductive pad and to form the first spacer layer disposed on the side walls of the bit line conductive layer pattern and the first insulating layer.

In the above case, the first spacer insulating layer can be of a nitride layer and the removing step of the first spacer insulating layer is performed by an etch-back process. The step of removing an upper portion of the bit line conductive layer pattern by a predetermined thickness can be performed by an etch-back process.

The forming of the insulating layer pattern and the second spacer layer may comprise: forming a second spacer insulating layer on an entire surface of a resultant substrate where a part of the bit line conductive layer pattern is removed; and removing a part of the second spacer insulating layer to expose the first spacer layer and the conductive pad and to form the insulating layer pattern on the bit line conductive layer pattern and the second spacer layer on the side wall of the first spacer layer.

BRIEF DESCRIPTION OF THE DRAWINGS

The above and other features and advantages of the present invention will become more apparent by the following description of detailed exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIGS. 1 to 13 are cross-sectional views illustrating a method of manufacturing a semiconductor memory device according to an embodiment of the present invention. FIG. 14 is a plan view of the resultant structure formed according to the processes shown in FIG. 1 through 5, FIG. 15 is a plan view of the resultant structure formed according to the processes shown in FIG. 6 through 9.

Figure 1:
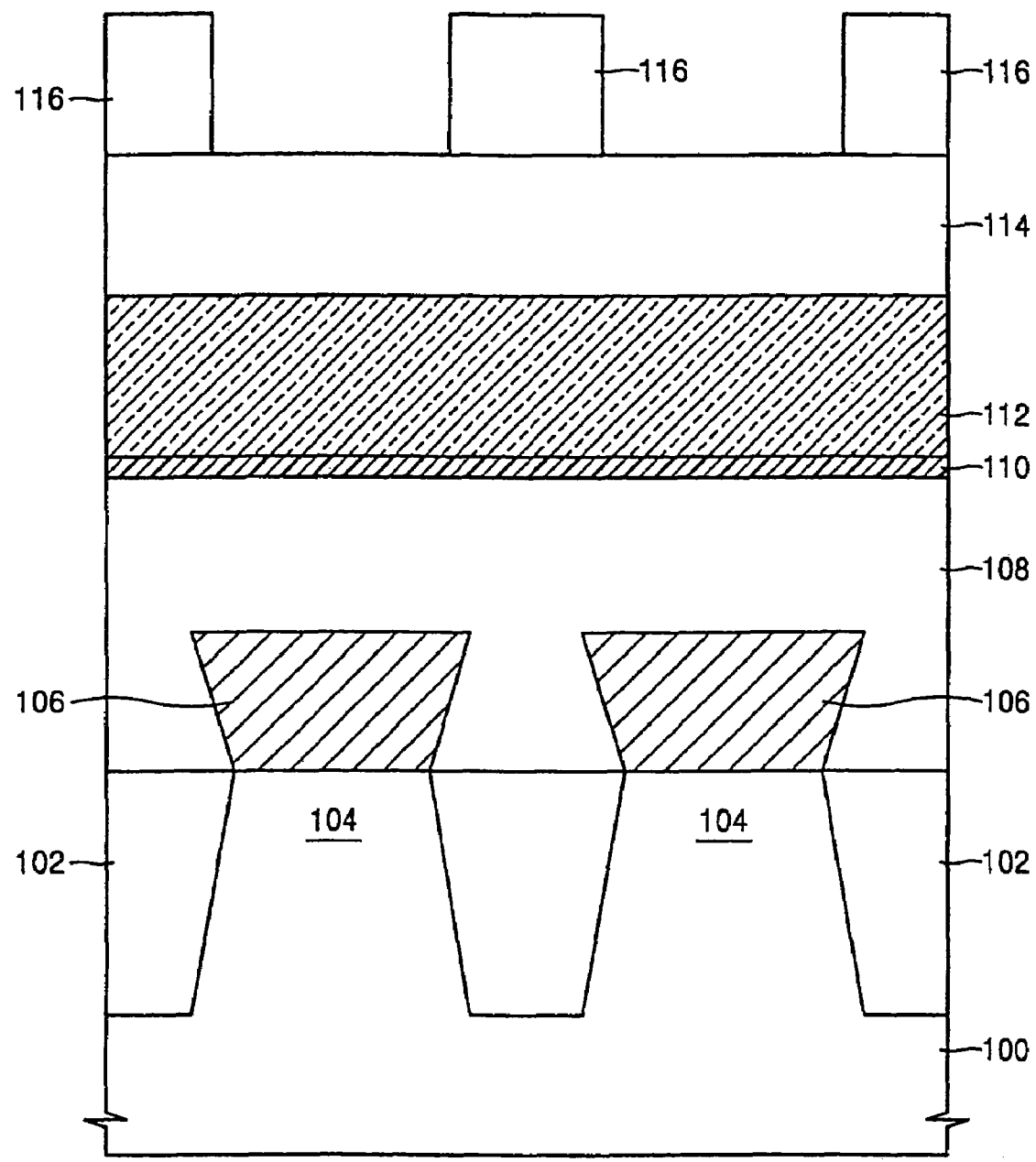
FIGS. 1 to 13 are cross-sectional views illustrating a method of manufacturing a semiconductor memory device according to an embodiment of the present invention.

First, referring to FIG. 1, an isolation layer 102 is formed in a semiconductor substrate 100 to define an active region 104. The isolation layer 102 may be formed using a shallow trench isolation STI or LOCOS (Local Oxidation of Silicon) process. On the semiconductor substrate 100, gate stacks (not shown) are formed. After the gate stacks are formed, an impurity ion implantation process for forming impurity regions such as source/drain regions can be performed. After the impurity regions (not shown) are formed, a conductive layer pad 106 is formed between adjacent gate stacks. The conductive layer pad 106 can be formed of polysilicon, and corresponds to a buried contact pad. Some of the plurality of conductive layer pads 106 can be used for other applications in addition to the application for the buried contact pad. A first insulating layer 108 is formed to fully cover the conductive layer pad 106. A barrier layer 110, a bit line conductive layer 112 and a second insulating layer 114 are sequentially formed on the first insulating layer 108. The barrier layer 110 may be formed of Ti/TiN. The bit line conductive layer 112 may be formed of tungsten. The second insulating layer 114 is a hard mask layer, and can be formed of oxide. A photoresist layer pattern 116 is formed on the second insulating layer 114. This photoresist layer pattern 116 has an opening that exposes a region of the second insulating layer 114.

Figure 2:
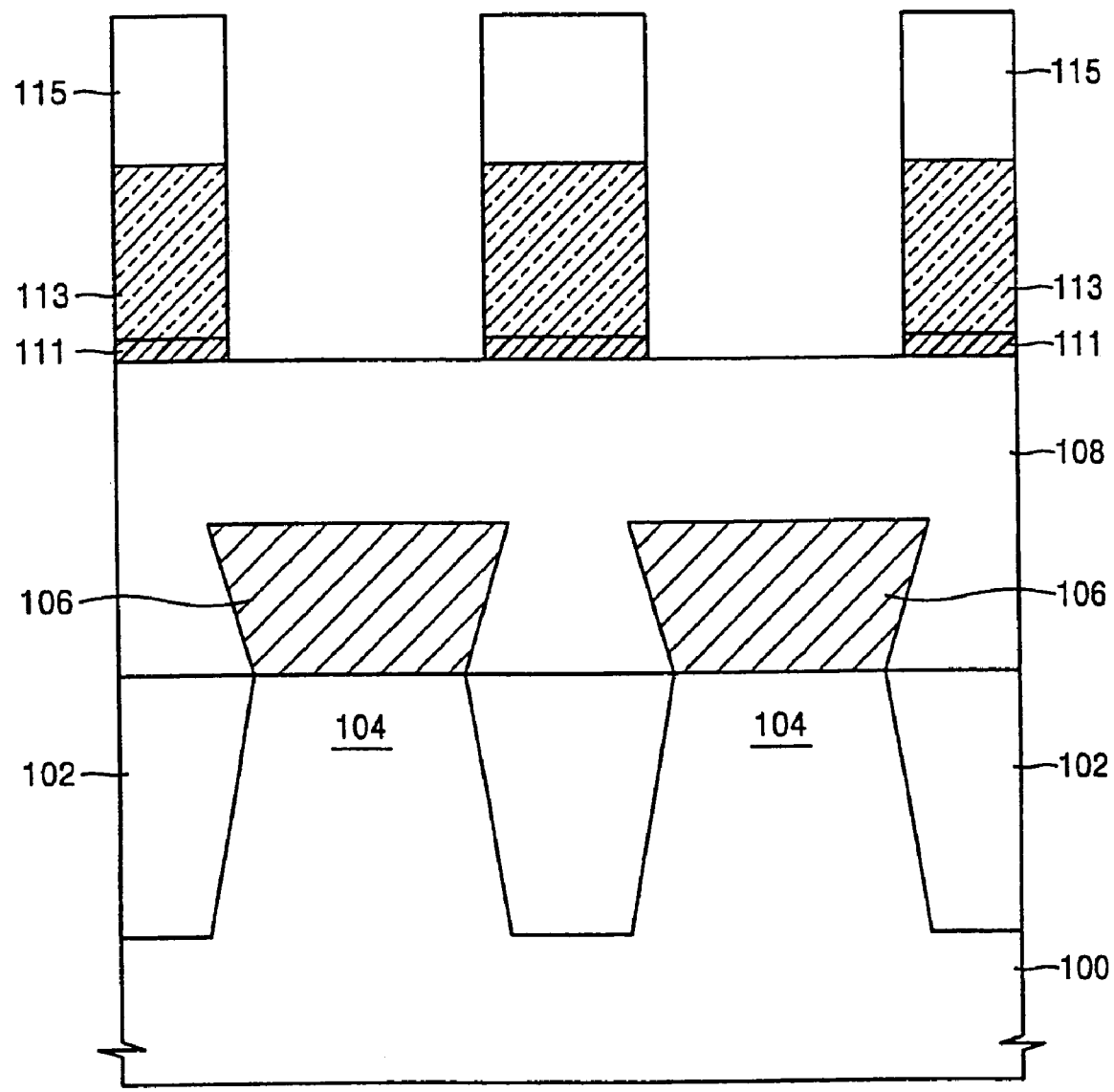

Next, as shown in FIG. 2, an etch process using the photoresist layer pattern 116 as an etch mask is performed to sequentially remove exposed portions of the second insulating layer 114, the bit line conductive layer 112 and the barrier layer 110. As a result, a stack structure where a barrier layer pattern 111, a bit line conductive layer pattern 113 and a second insulating layer pattern 115 are sequentially stacked is made. After the completion of the etch process, the photoresist layer pattern 116 is removed.

Figure 3:
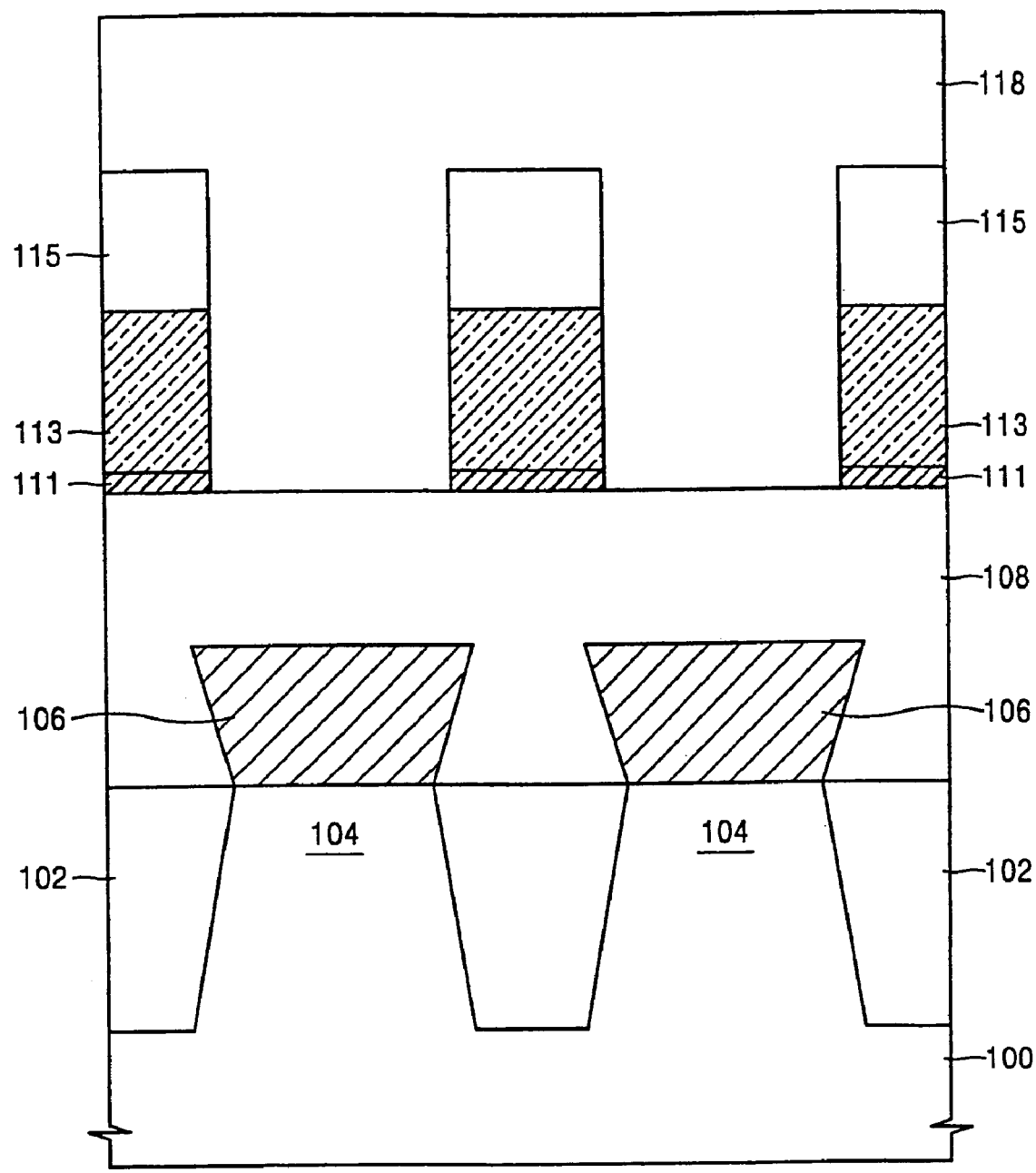

Next, as shown in FIG. 3, a third insulating layer 118 is formed to cover the barrier layer pattern 111, the bit line conductive layer pattern 113 and the second insulating layer pattern 115. The third insulating layer 118 is formed of a material having a sufficient etch selectivity with respect to the bit line conductive layer pattern 113. This is because a subsequent etch process for removing the third insulating layer 118 is performed in a state where a part of the bit line conductive layer pattern 113 is exposed by the etch mask along with the third insulating layer 118. If the bit line conductive layer pattern 113 is formed of tungsten, it is suitable for the third insulating layer 118 to be formed of oxide.

Figure 4:
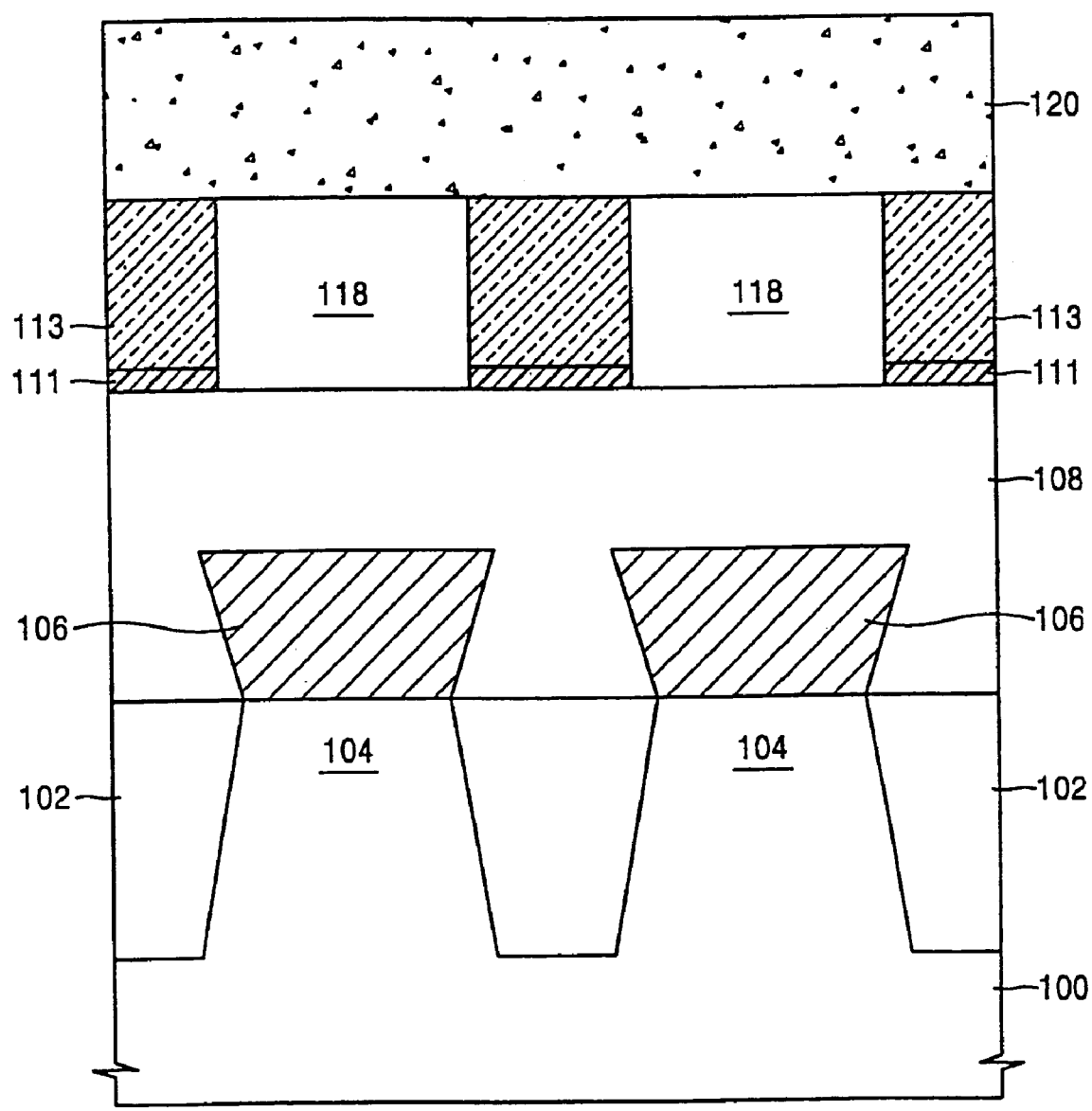
Figure 5:
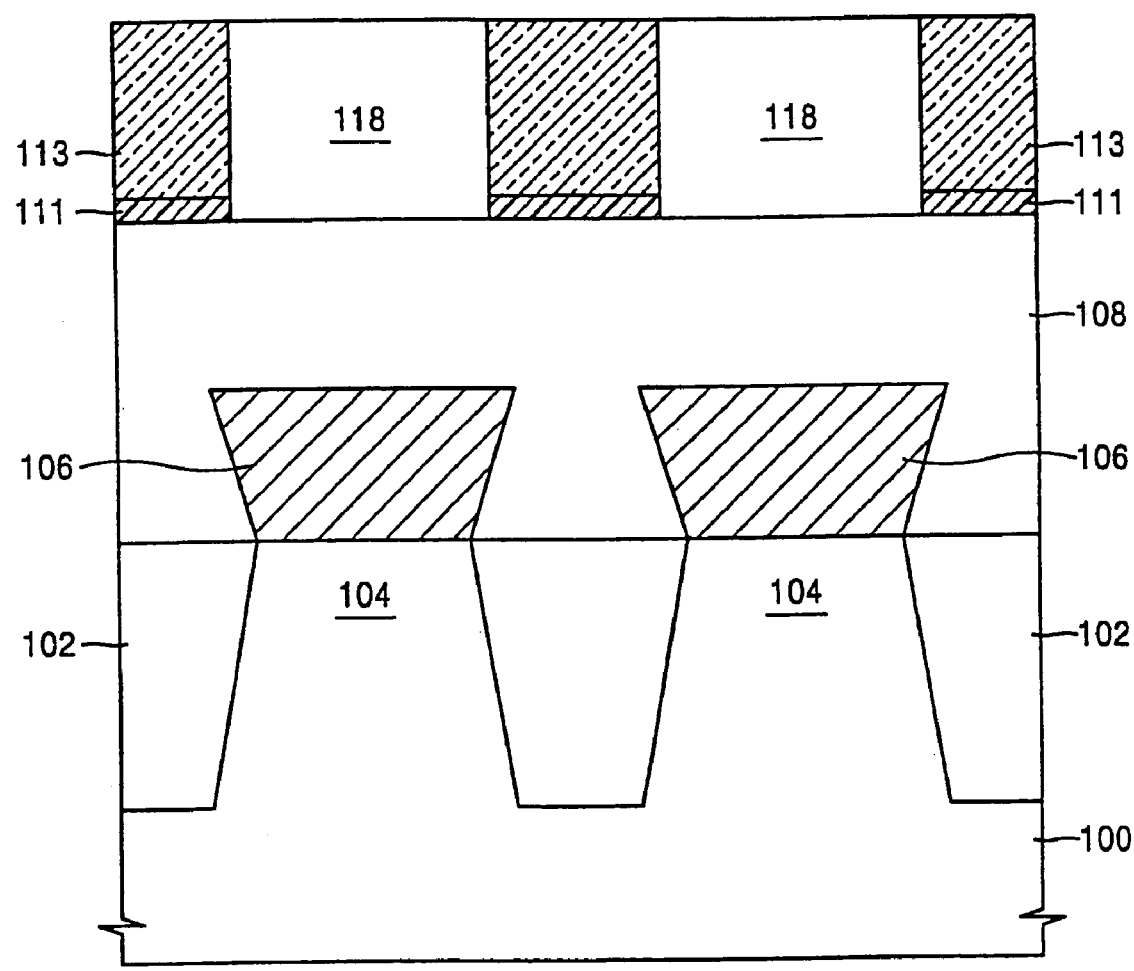

Next, as shown in FIGS. 4 and 5, a planarizing process of the third insulating layer 118 is performed. This planarizing process is performed until the upper surface of the bit line conductive layer pattern 113 is exposed. By performing this planarizing process, a part of the third insulating layer 118 is removed, and as the third insulating layer 118 is removed, the exposed second insulating layer pattern 115 is also removed. The planarizing process can be performed by conventional planarizing techniques such as a chemical mechanical polishing (CMP) method. A photoresist layer pattern 120 is formed on the exposed bit line conductive layer pattern 113 and the exposed third insulating layer 118. This photoresist layer pattern 120 is made in a stripe shape.

The plan view of a resultant structure made by the processes discussed above is shown in FIG. 14. FIGS. 1 to 4 are cross-sectional views taken along line A-A' of FIG. 14. FIG. 5 is a cross-sectional view taken along line B-B' of FIG. 14.

As shown in FIG. 14, the bit line conductive layer pattern 113 is arranged in the form of a stripe extending in a longitudinal direction. Between the bit line conductive layer patterns 113, the third insulating layer 118 is arranged. The photoresist layer pattern 120 is arranged in the form of a stripe extending in a lateral direction. Accordingly, the photoresist layer pattern 120 crosses the bit line conductive layer pattern 113 and the third insulating layer 118.

Figure 6:
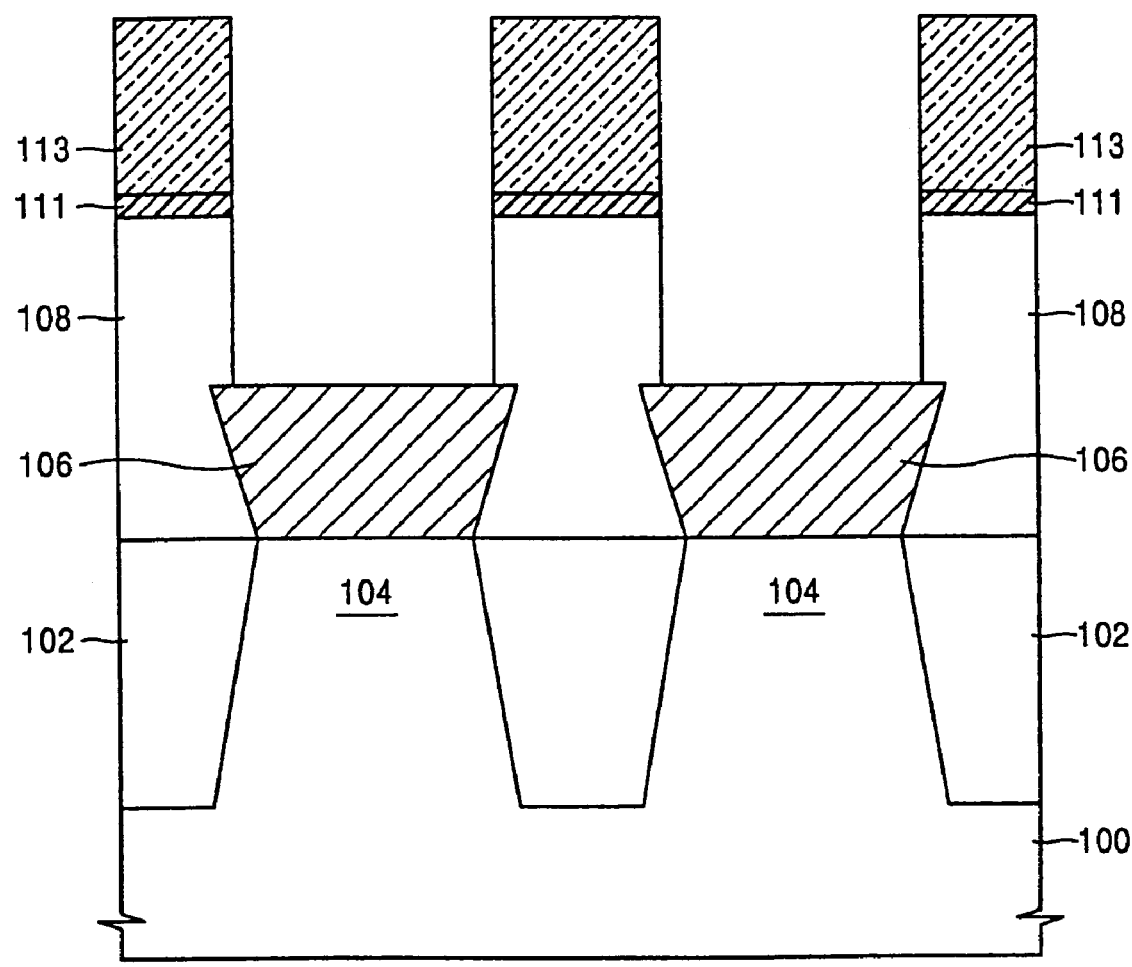

After the processes described above with reference to FIGS. 1 to 4 are performed, an etch process results in the structure shown in FIG. 6. The an etch process uses the photoresist layer pattern (see 120 of FIG. 14) as an etch mask to remove the exposed portion of the third insulating layer 118. As shown in FIGS. 4, 5 and 14, although the bit line conductive layer pattern 113 is partly exposed by the photoresist layer pattern 120, the etch selectivity between the third insulating layer 118 and the bit line conductive layer pattern 113 allows only the exposed portion of the third insulating layer 118 to be removed, and the exposed portion of the bit line conductive layer pattern 113 is left substantially unetched. As the exposed portion of the third insulating layer 118 is removed, a part of the side wall of the first insulating layer 108 and an upper surface of the conductive layer pad 106 are exposed. After the etch process is completed, the photoresist layer pattern 120 is removed.

Figure 7:
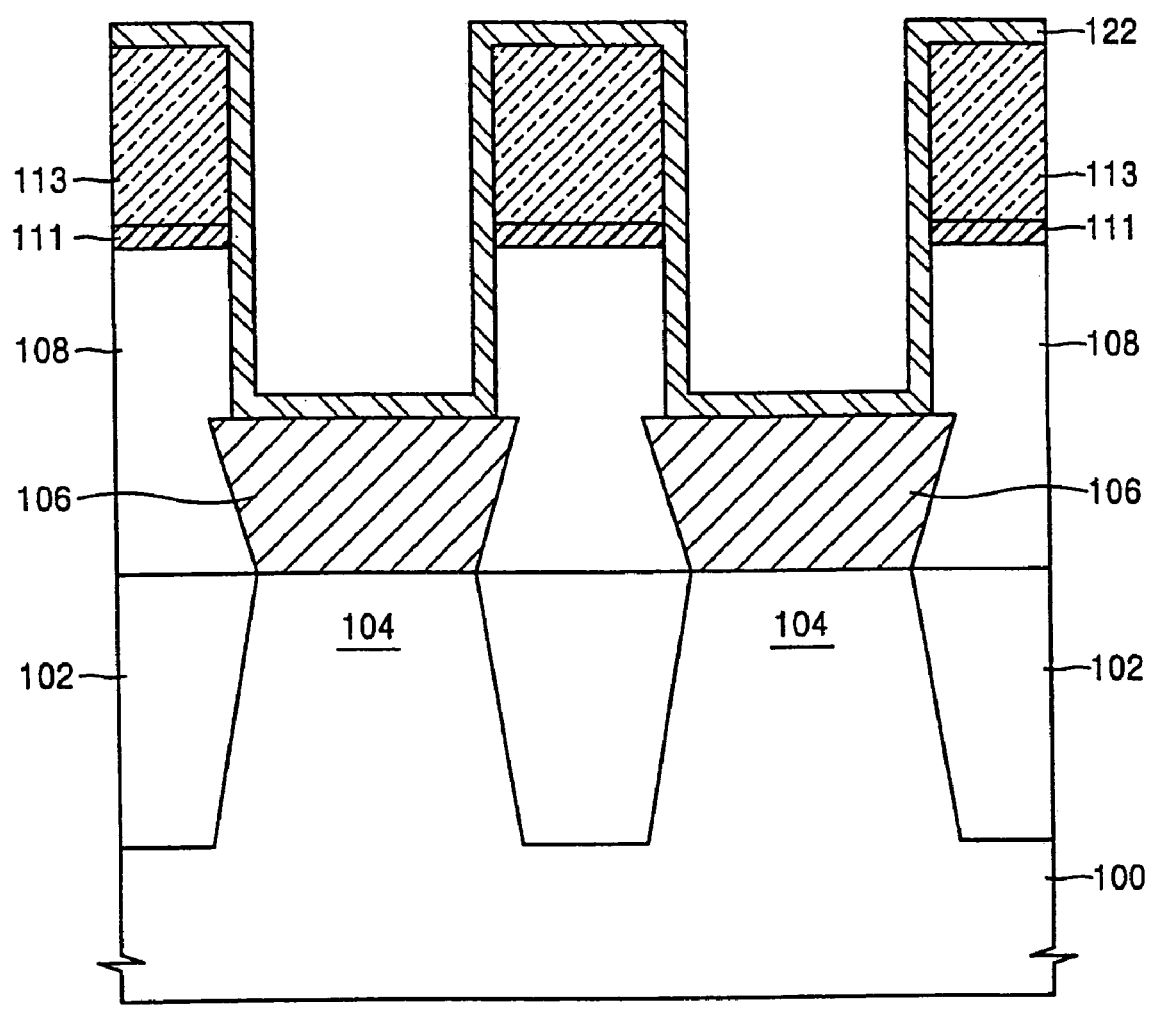

Next, as shown in FIG. 7, a first spacer insulating layer 122 is formed on the resultant structure where the photoresist layer pattern 120 has been removed. The first spacer insulating layer 122 may be formed of silicon nitride. The first spacer insulating layer 122 covers the resulting structure including the upper and side surfaces of the bit line conductive layer pattern 113, the side surface of the barrier layer pattern 111, the exposed surface of the first insulating layer 108 and the upper surface of the conductive layer pad 106.

Figure 8:
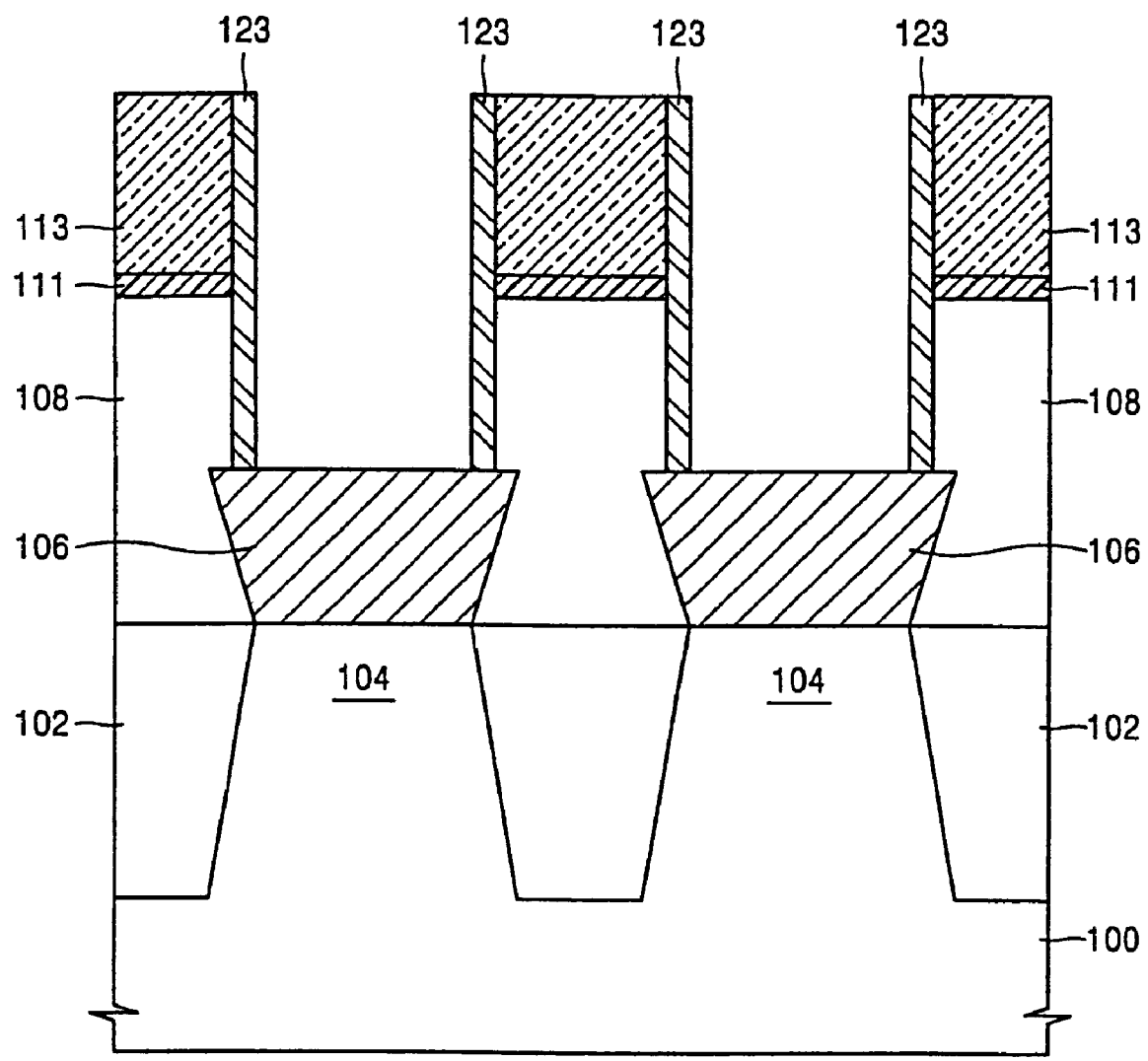

Next, as shown in FIG. 8, the first spacer insulating layer (see 122 of FIG. 7) is partly removed such that the upper surface of the bit line conductive layer pattern 113 and the upper surface of the conductive layer pattern 106 are exposed. As a result, a first spacer layer 123 arranged only on the side surfaces of the bit line conductive layer pattern 113, the barrier layer pattern 111 and the first insulating layer 108, is made. The formation of the first spacer layer 123 can be performed by etching-back the first spacer insulating layer (see 122 of FIG. 7).

Figure 9:
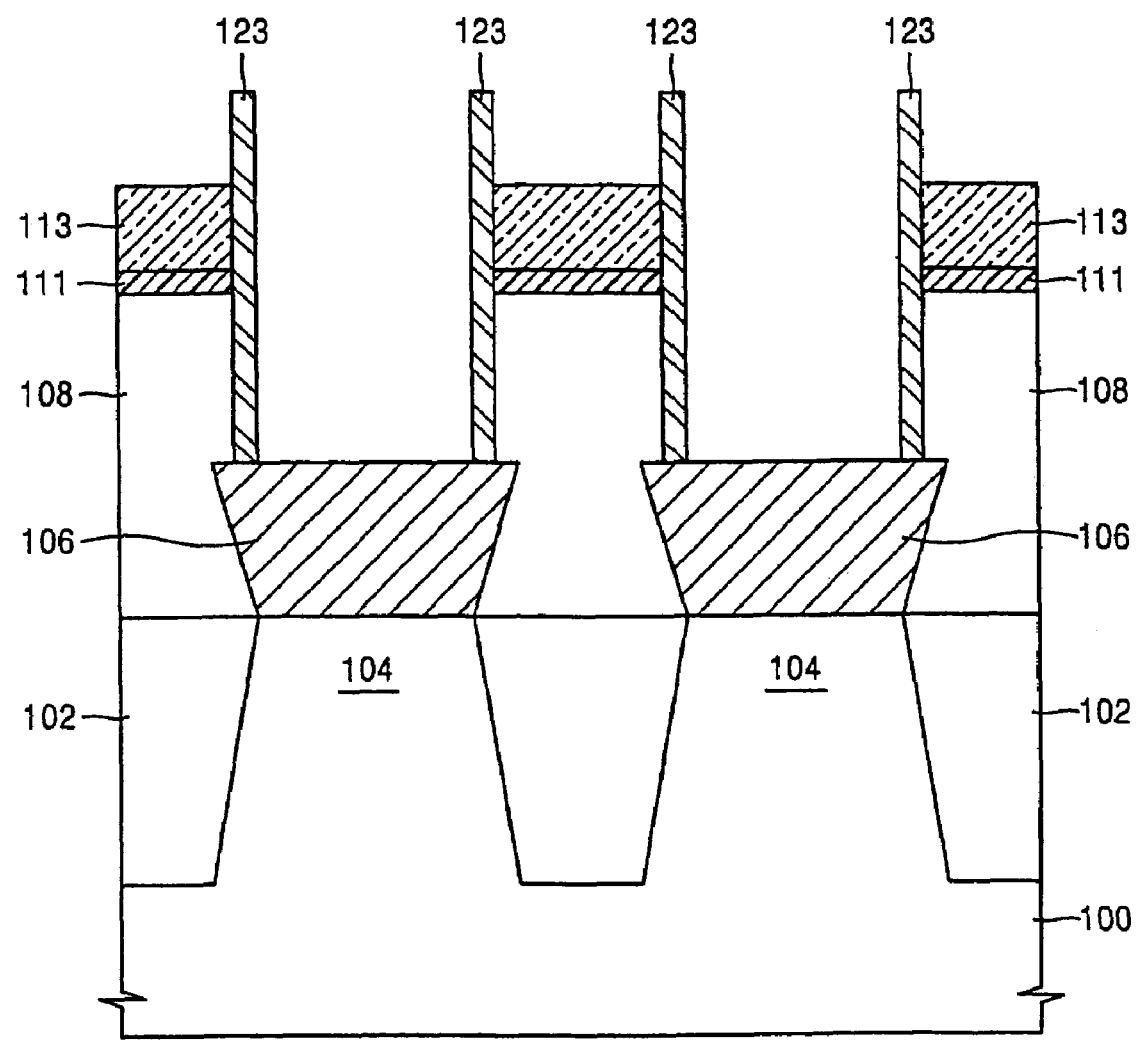

Next, as shown in FIG. 9, the bit line conductive layer pattern 113 whose upper surface is exposed is removed by a predetermined thickness. The removal of the bit line conductive layer pattern 113 can be performed by an etch-back process. As the bit line conductive layer pattern 113 is partly removed, the first spacer layer 123 has a shape protruded by the removed thickness of the bit line conductive layer pattern 113.

Figure 10:
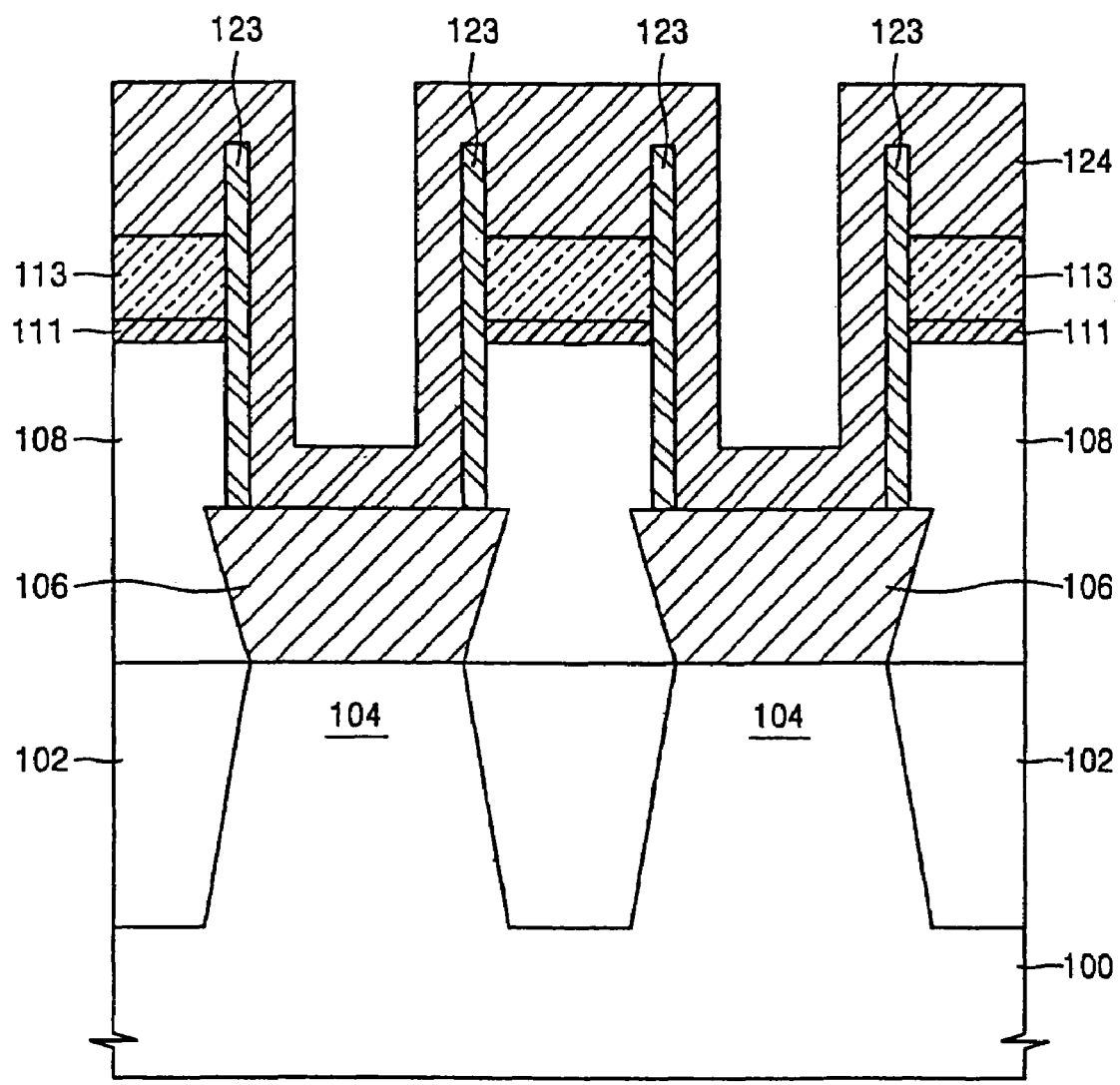

Next, as shown in FIG. 10, a second spacer insulating layer 124 is formed to cover the bit line conductive layer pattern 113, the first spacer layer 123 and the conductive layer pad 106. The second spacer insulating layer 124 may be formed of silicon nitride. The second spacer layer 124 is preferably formed to a sufficient thickness to substantially completely cover the first spacer layer 123.

Figure 11:
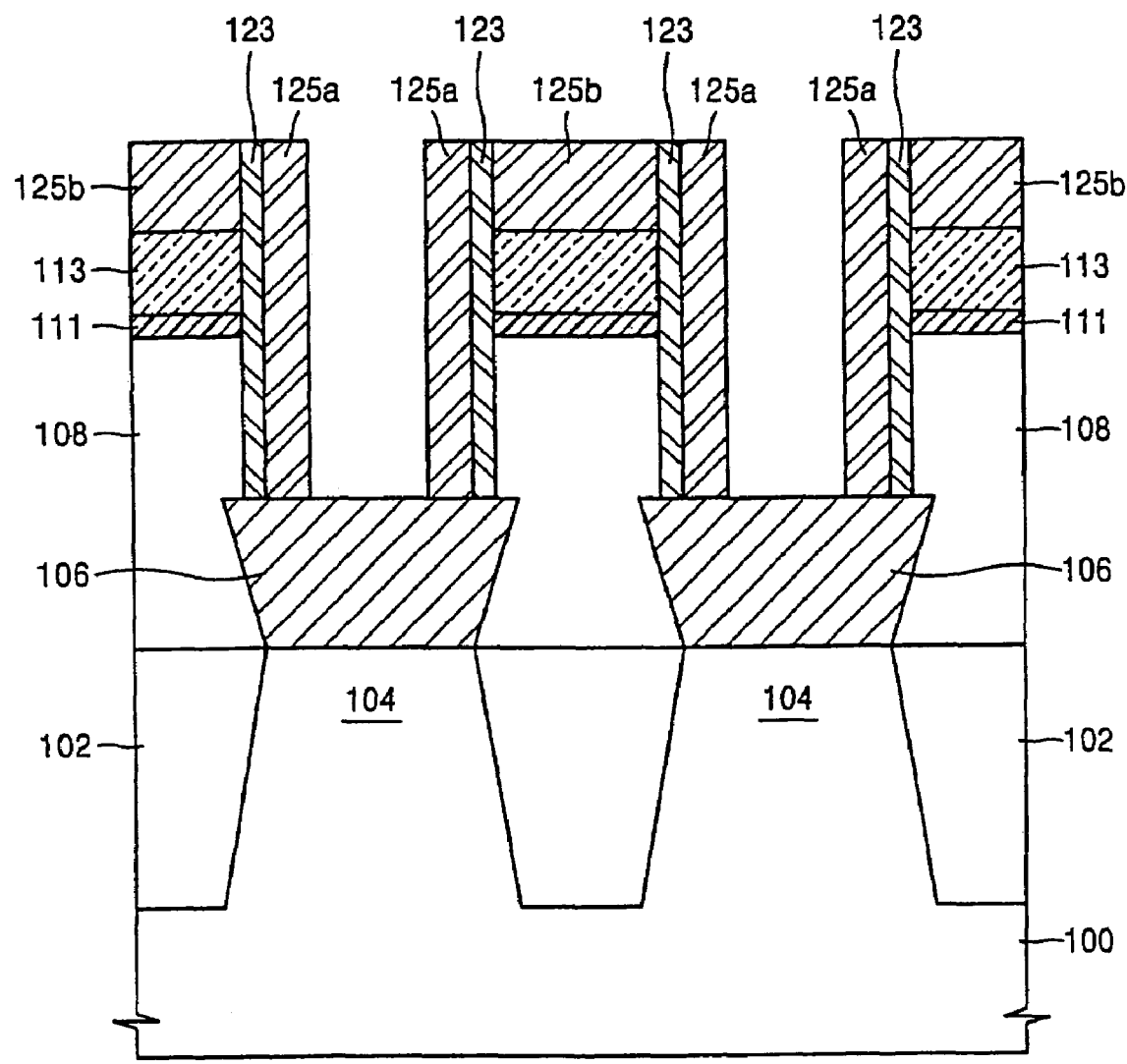

Next, as shown in FIG. 11, a part of the second spacer insulating layer (see 124 of FIG. 10) is removed such that an upper surface of the conductive layer pattern 106 is exposed. In this removing step, the first spacer layer 123 is also partly exposed. As a result, a second spacer layer 125*a* arranged on the side surface of the first spacer layer 123 and a second spacer insulating layer pattern 125*b* arranged on the upper surface of the bit line conductive layer pattern 113 are made. The second spacer layer 125*a* and the second spacer insulating layer pattern 125*b* can be formed by an etch-back process.

Figure 12:
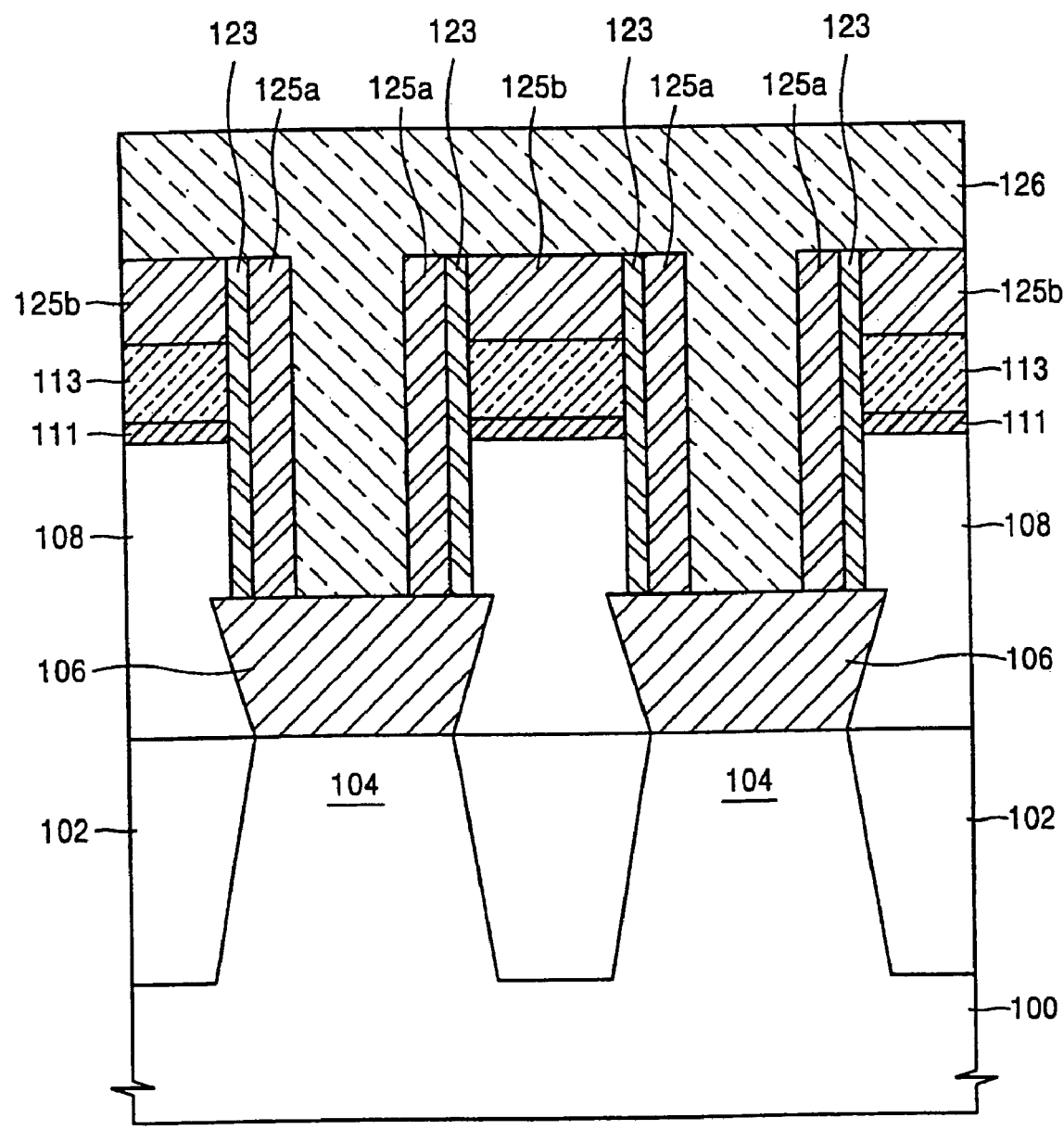

Next, as shown in FIG. 12, a conductive layer 126 for a buried contact is formed on an entire surface of a resultant substrate where the second spacer layer 125*a* and the second spacer insulating layer pattern 125*b* have been formed. The conductive layer 126 completely fills the inside of a contact hole formed by the second spacer layer 125*a*, and is accordingly directly in contact with the conductive layer pattern 106 inside the contact hole. The conductive layer 126 is formed of a polysilicon layer.

Figure 13:
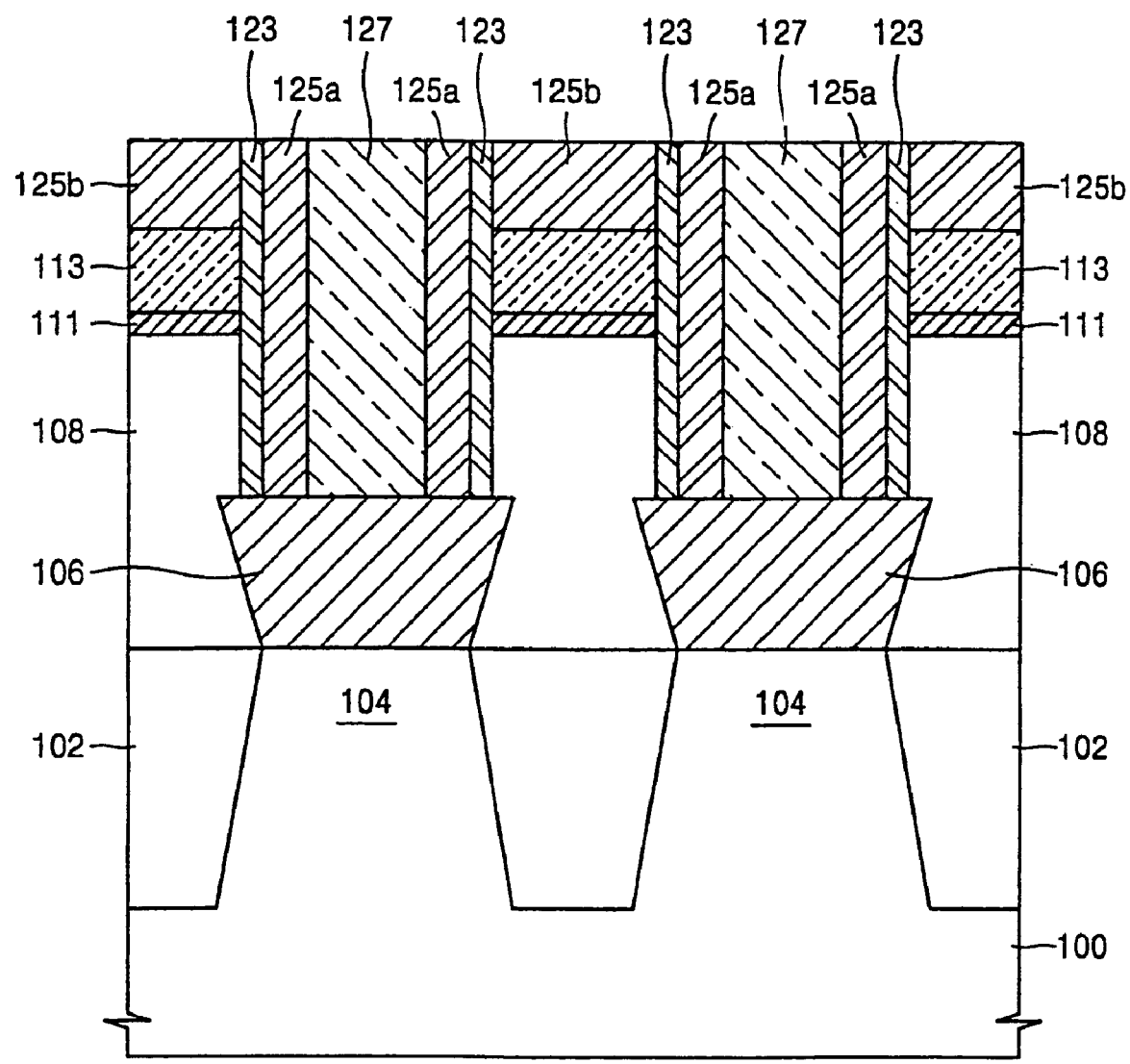
Figure 14:
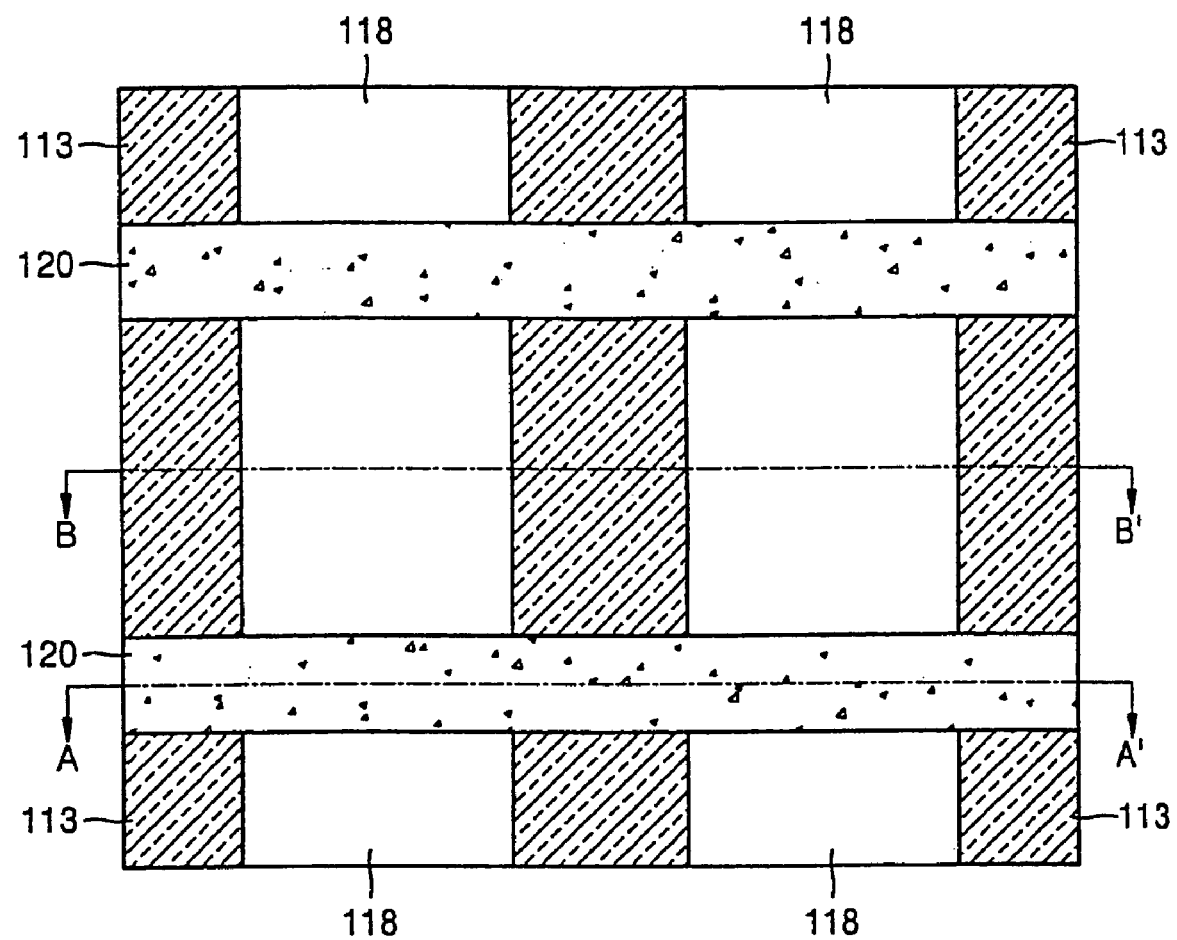
FIG. 14 is a plan view showing a resultant substrate after the processes of FIG. 1 through 5 are performed.

Next, as shown in FIG. 13, the conductive layer 126 is etched back so that the conductive layer arranged on the upper surfaces of the second spacer insulating layer pattern 125*b*, the first spacer layer 123 and the second spacer layer 125*a* is removed. As a result, a conductive plug 127 filling only the contact hole defined by the second spacer layer 125*a* is made.

Figure 15:
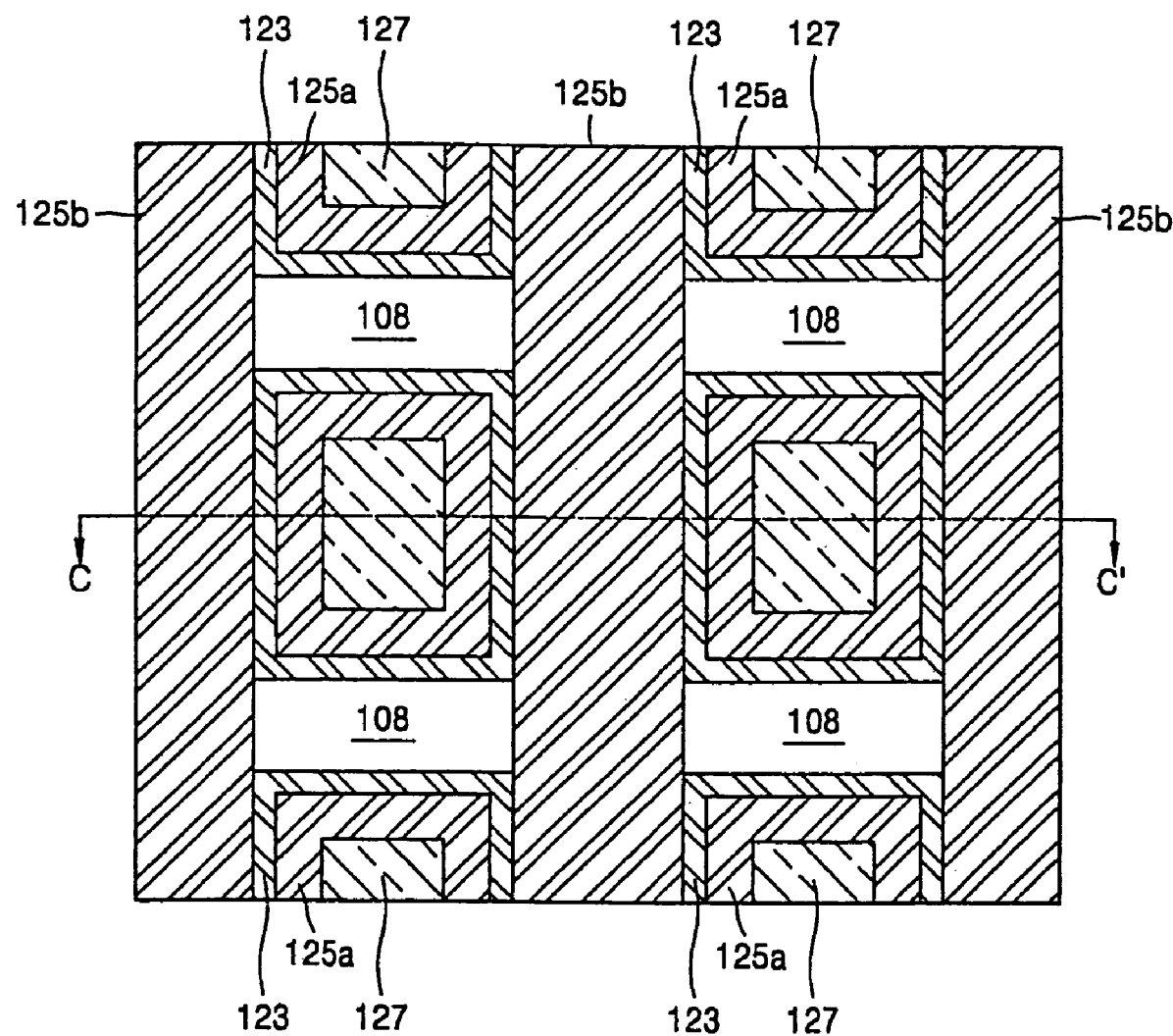
FIG. 15 is a plan view showing a resultant substrate after the processes of FIG. 6 through 13 are performed.

The plan view of a resultant structure made by the processes up to now is shown in FIG. 15. FIGS. 6 to 13 are cross-sectional views taken along line C-C' of FIG. 15. As shown in FIG. 15, the second spacer layer 125*a* and the first spacer layer 123 sequentially enclose the conductive plug 127. At the left and right sides outside the first spacer layer 123, the second spacer insulating layer pattern 125*b* is arranged extending in a longitudinal direction. At the left and right sides outside the first spacer layer 123, the first insulating layer 108 is arranged.

FIGS. 16 to 28 are cross-sectional views for illustrating a method for manufacturing a semiconductor memory device according to another embodiment of the present invention.

Figure 16:
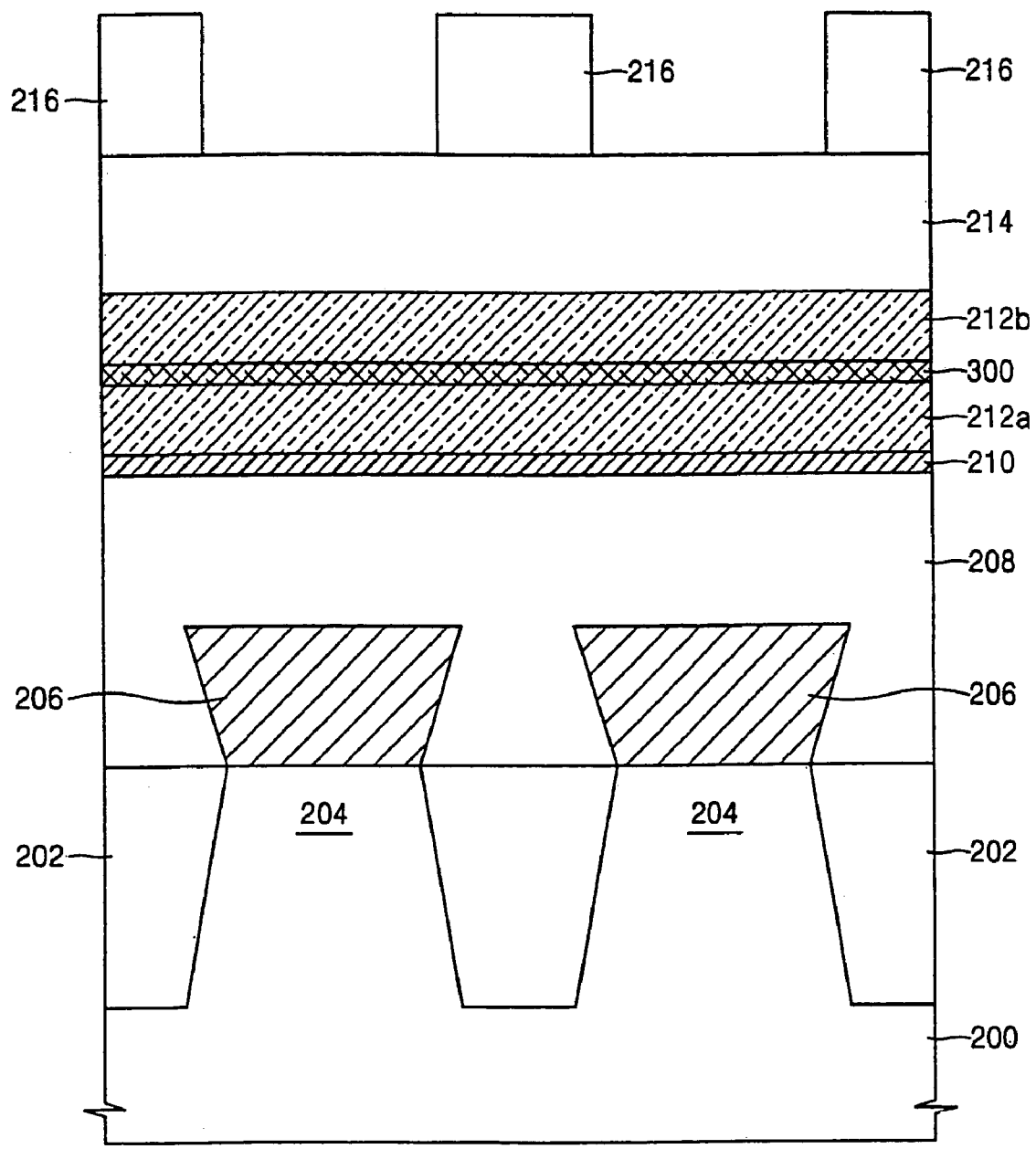
FIGS. 16 to 28 are cross-sectional views for illustrating a method for manufacturing a semiconductor memory device according to another embodiment of the present invention.

First, as shown in FIG. 16, an isolation layer 202 is formed on a semiconductor substrate 200 to define an active region 204. The isolation layer 202 may be formed by using a LOCOS process instead of the trench type isolation layer 202. On the semiconductor substrate 200, gate stacks (not shown) are formed. After the gate stacks are formed, an impurity ion implantation process for forming impurity regions (not shown) can be performed. After the impurity regions (not shown) are formed, a conductive layer pad 206 is formed between adjacent gate stacks. The conductive layer pad 206 can be formed of a polysilicon layer. A first insulating layer 208 is formed to fully cover the conductive layer pad 206.

A barrier layer 210 is formed on the first insulating layer 208. On the barrier layer 210 a first bit line conductive layer 212*a*, an etch stopper layer 300 and a second bit line conductive layer 212*b* are sequentially formed. On the second bit line conductive layer 212*b*, a second insulating layer 214 is formed. The barrier layer 210 may be formed of Ti/TiN. The first and second bit line conductive layers 212*a* and 212*b* are formed of tungsten. The etch stopper layer 300 is used as an etch stopper layer in an etch process for removing the second bit line conductive layer 212*b*, and is, therefore, formed of a material having a high etch selectivity with respect to the second bit line conductive layer 212*b*. When the second bit line conductive layer 212*b* is formed of tungsten, a silicon nitride layer can be used as the etch stopper layer 300. The second insulating layer 215 is a hard mask layer, and can be formed of oxide. A photoresist layer pattern 216 is formed on the second insulating layer 214. This photoresist layer pattern 216 has an opening to expose a portion of the second insulating layer 214.

Figure 17:
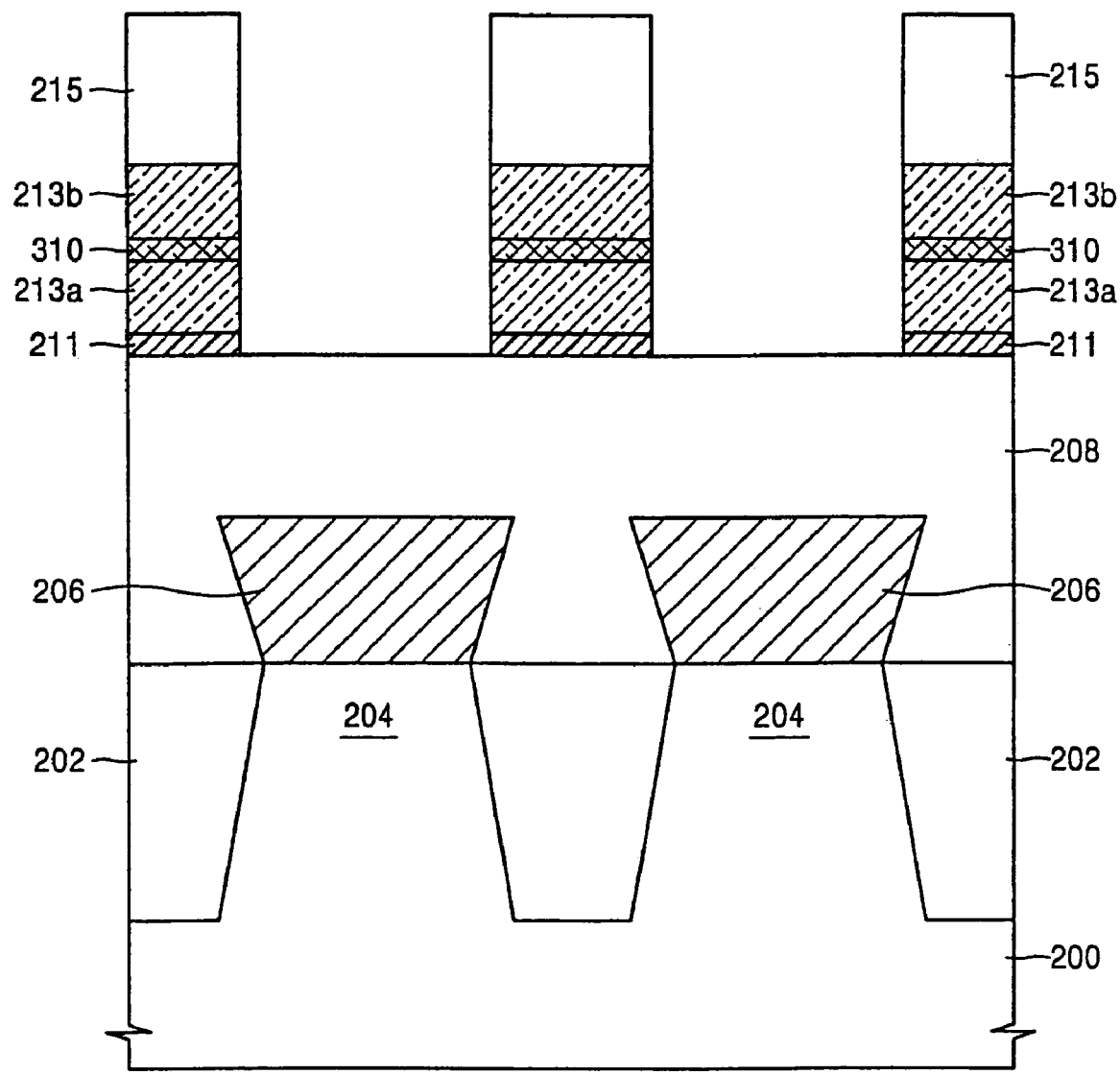

Next, as shown in FIG. 17, an etch process using the photoresist layer pattern 216 as an etch mask is performed to sequentially remove exposed portions of the second insulating layer 214, the second bit line conductive layer 212*b*, the etch stopper layer 300, the first bit line conductive layer 212*a* and the barrier layer 210. As a result, a structure where a barrier layer pattern 211, a first bit line conductive layer pattern 213*a*, an etch stopper layer pattern 310, a second bit line conductive layer pattern 213b and a second insulating layer pattern 215 are sequentially stacked is made. After the completion of the etch process, the photoresist layer pattern 216 is removed.

Figure 18:
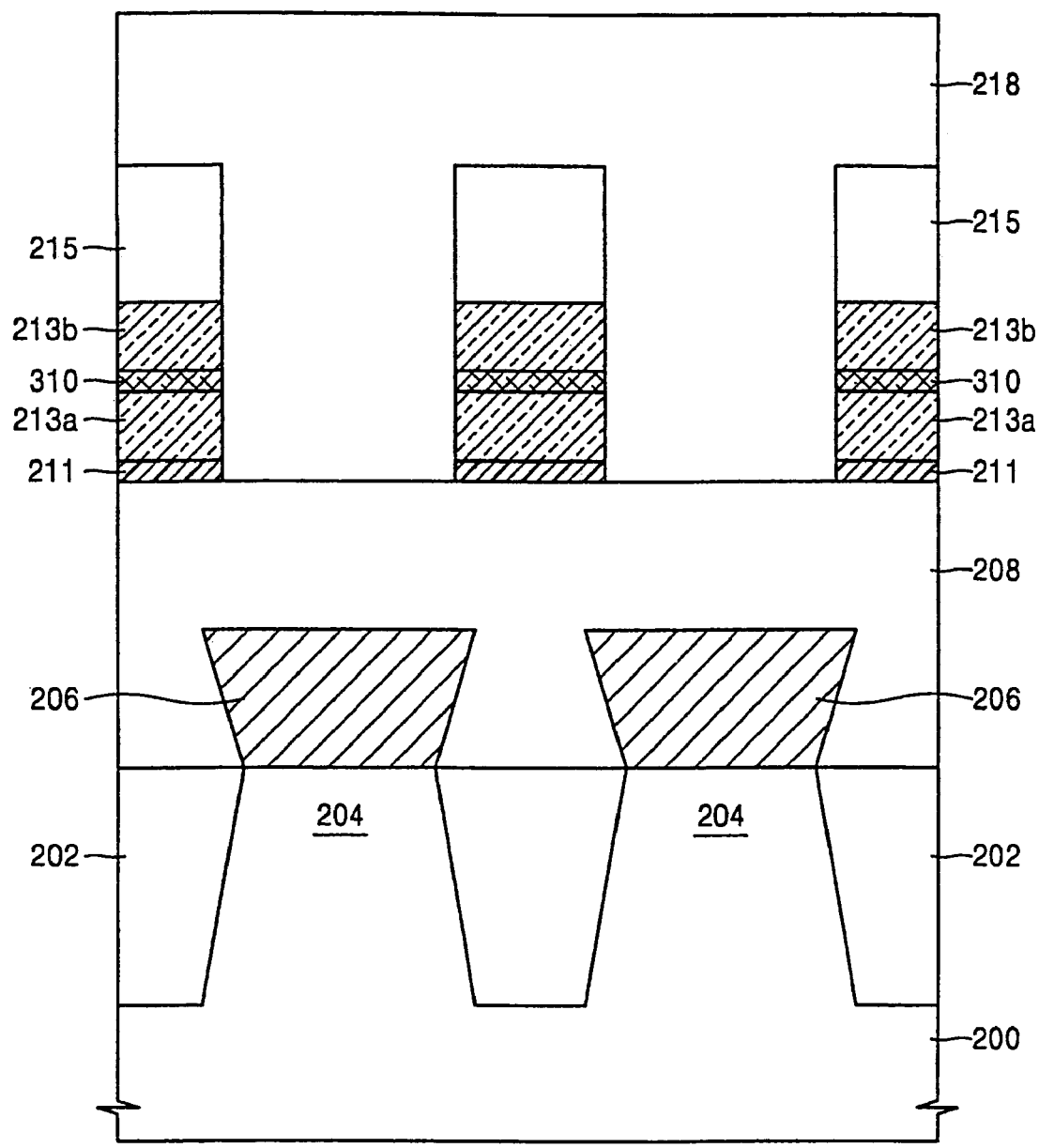

Next, as shown in FIG. 18, a third insulating layer 218 is formed to entirely cover the barrier layer pattern 211, the first bit line conductive layer pattern 213a, the etch stopper layer pattern 310, the second bit line conductive layer pattern 213b and the second insulating layer pattern 215. The third insulating layer 218 is formed of a material having a sufficient etch selectivity with respect to the second bit line conductive layer pattern 213b. This is because a subsequent etch process for removing the third insulating layer 218 is performed in a state where a part of the second bit line conductive layer pattern 213b is exposed by the etch mask along with the third insulating layer 218. For example, if the second bit line conductive layer pattern 213b is formed of tungsten, it is suitable for the third insulating layer 218 to be formed of oxide.

Figure 19:
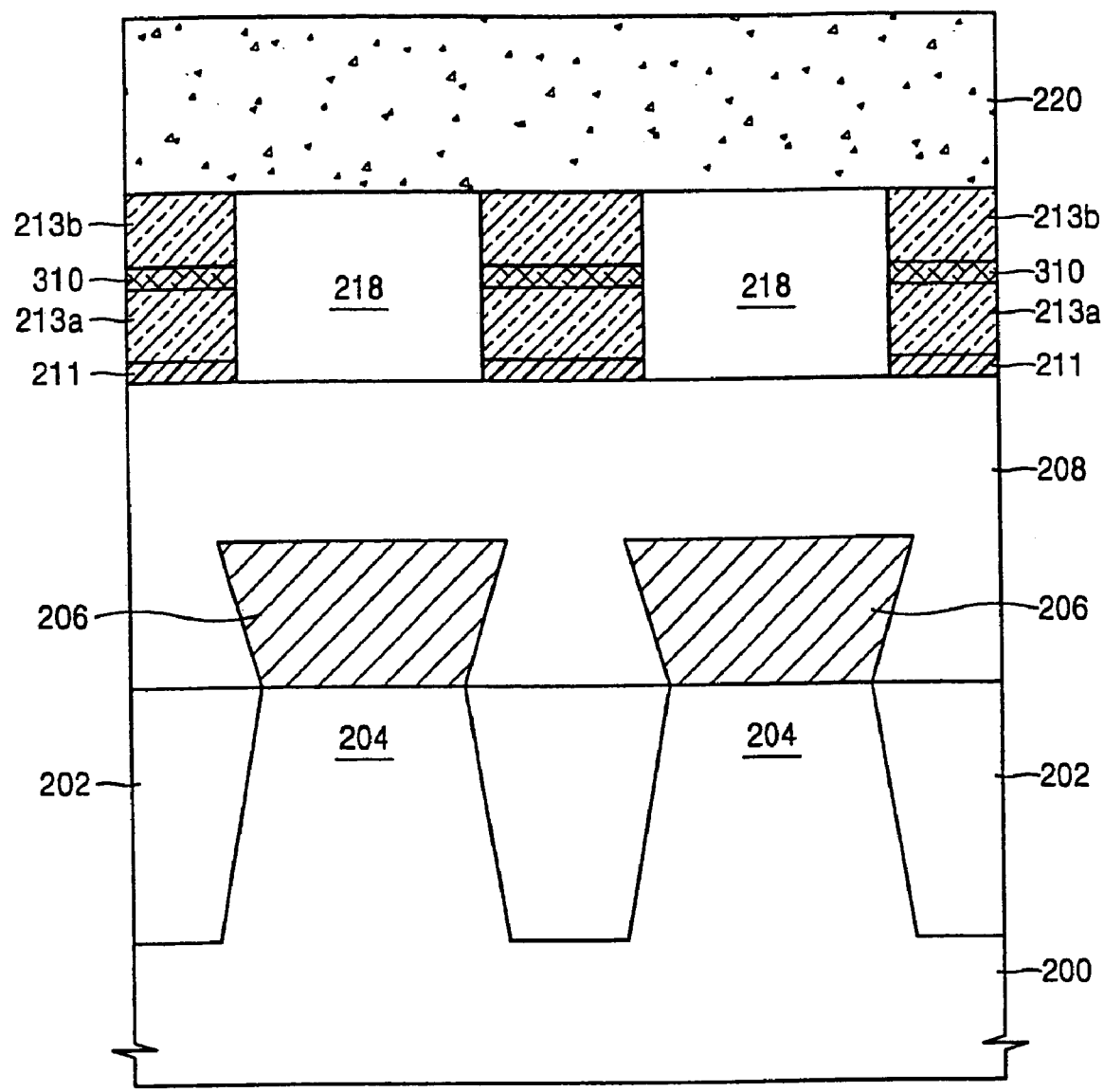
Figure 20:
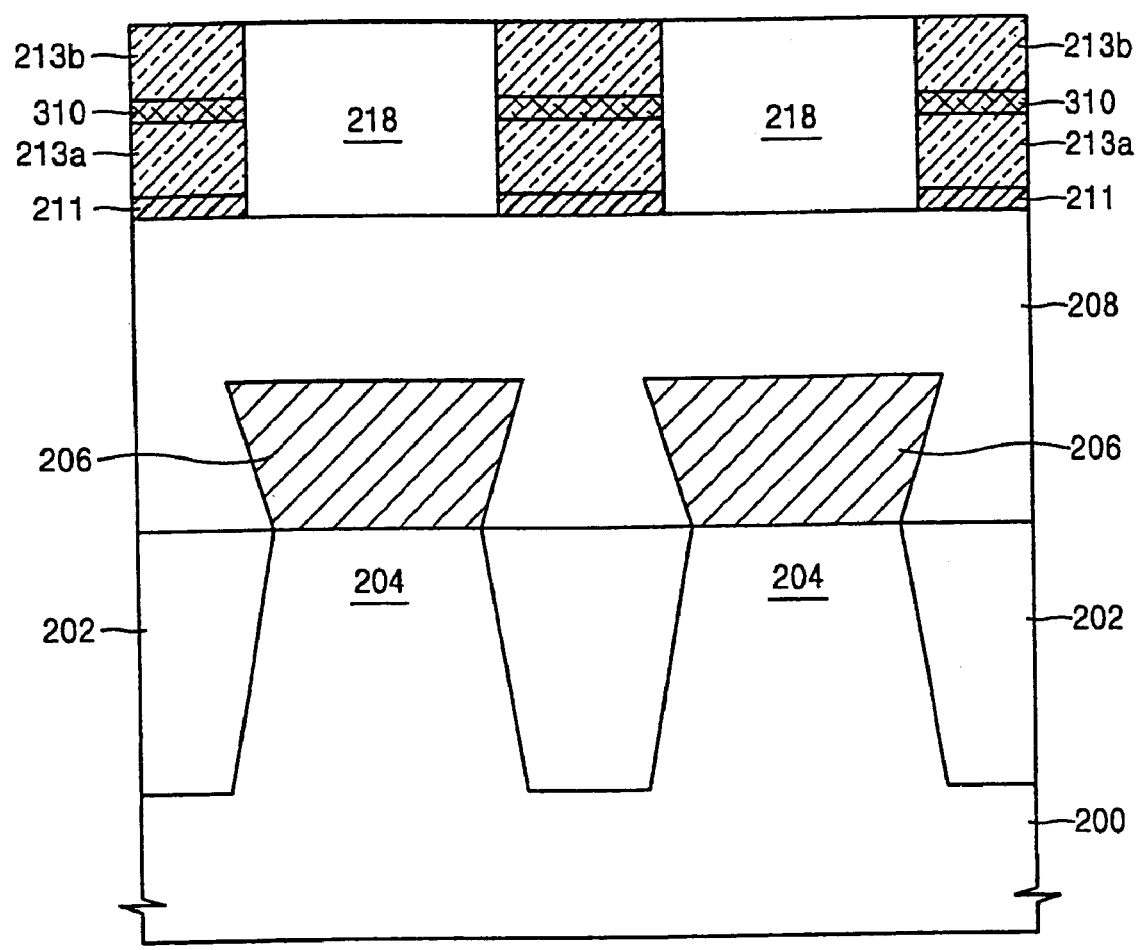

Next, as shown in FIGS. 19 and 20, a planarizing process of the third insulating layer 218 is performed. This planarizing process is performed until the upper surface of the second bit line conductive layer pattern 213b is exposed. In other words, by performing this planarizing process, a part of the third insulating layer 218 is removed, and as the third insulating layer 218 is removed, the exposed second insulating layer pattern 215 is also removed. The planarizing process may be performed by conventional planarizing techniques such as chemical mechanical polishing (CMP). A photoresist layer pattern 220 is formed on the exposed second bit line conductive layer pattern 213b and the exposed third insulating layer 218. This photoresist layer pattern 220 is made in a stripe shape. Since the plan view of a resultant structure made by the processes discussed above is the same as that shown in FIG. 14, its description will be omitted herein.

Figure 21:
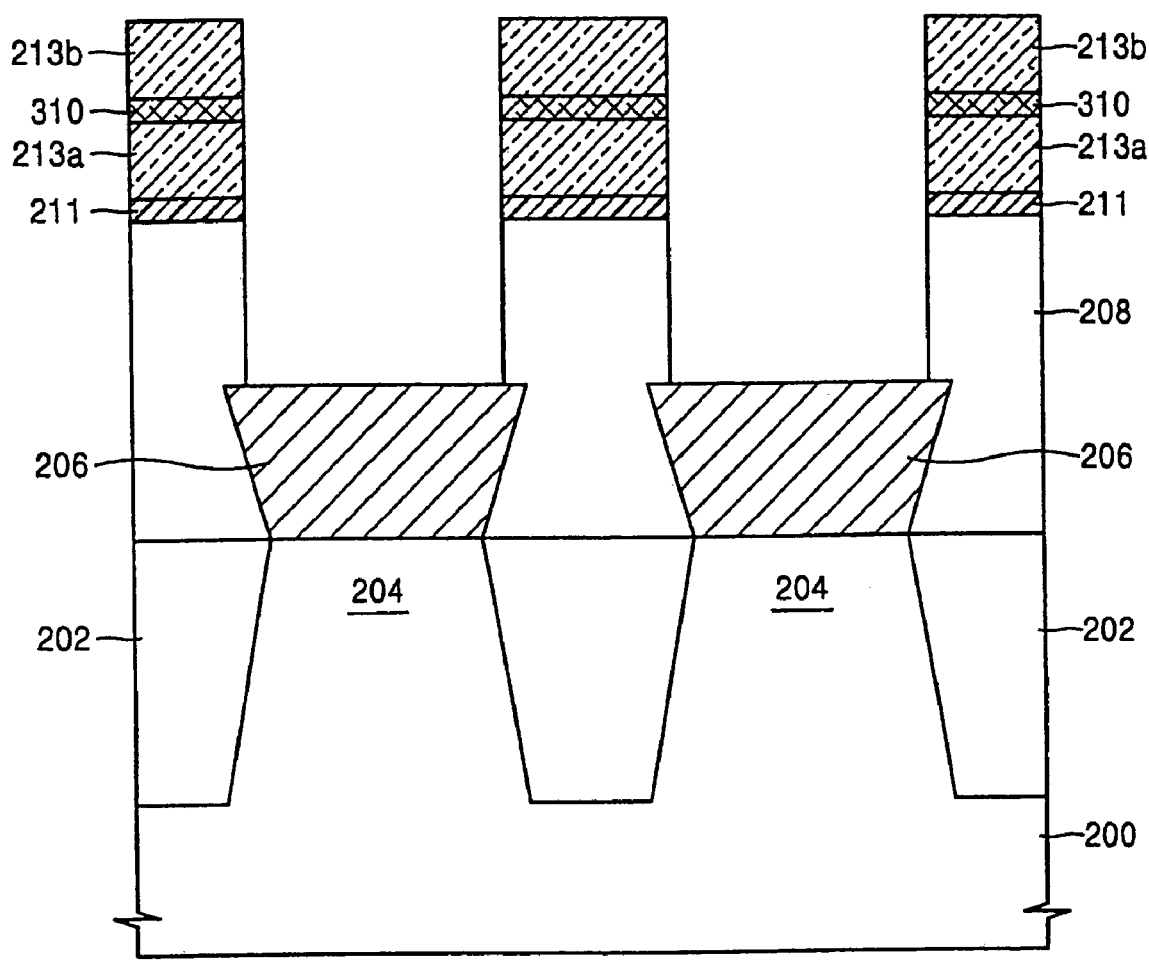

Next, as shown in FIG. 21, an etch process using the photoresist layer pattern (see 220 of FIG. 19) as an etch mask is performed to remove the exposed portion of the third insulating layer 218. As shown in FIG. 20, although the second bit line conductive layer pattern 213b is partly exposed by the photoresist layer pattern 220, the etch selectivity between the third insulating layer 218 and the second bit line conductive layer pattern 213b allows only the exposed portion of the third insulating layer 218 to be removed after the etch process, and the exposed portion of the second bit line conductive layer pattern 213b is left substantially unetched. As the exposed portion of the third insulating layer 218 is removed, a part of the side wall of the first insulating layer 208 and an upper surface of the conductive layer pad 206 are exposed. After the etch process is completed, the photoresist layer pattern 220 is removed.

Figure 22:
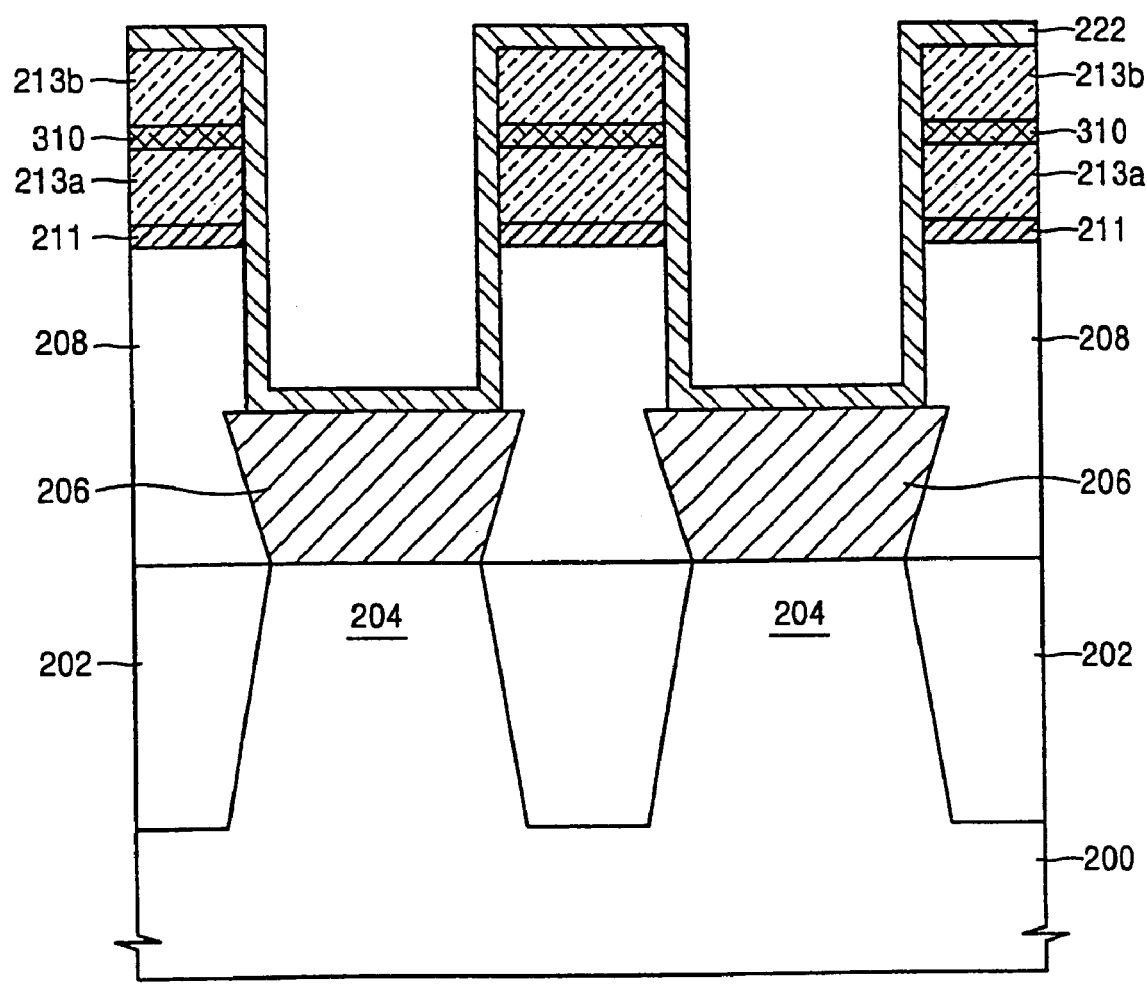

Next, as shown in FIG. 22, a first spacer insulating layer 222 is formed on the resultant substrate where the photoresist layer pattern 220 has been removed. The first spacer insulating layer 222 may be formed of silicon nitride. The first spacer insulating layer 222 covers the resulting structure including the side surfaces of the first bit line conductive layer pattern 213a and the etch stopper layer pattern 310, the upper and side surfaces of the second bit line conductive layer pattern 213b, the side surface of the barrier layer pattern 211, the exposed surface of the first insulating layer 208 and the upper surface of the conductive layer pad 206.

Figure 23:
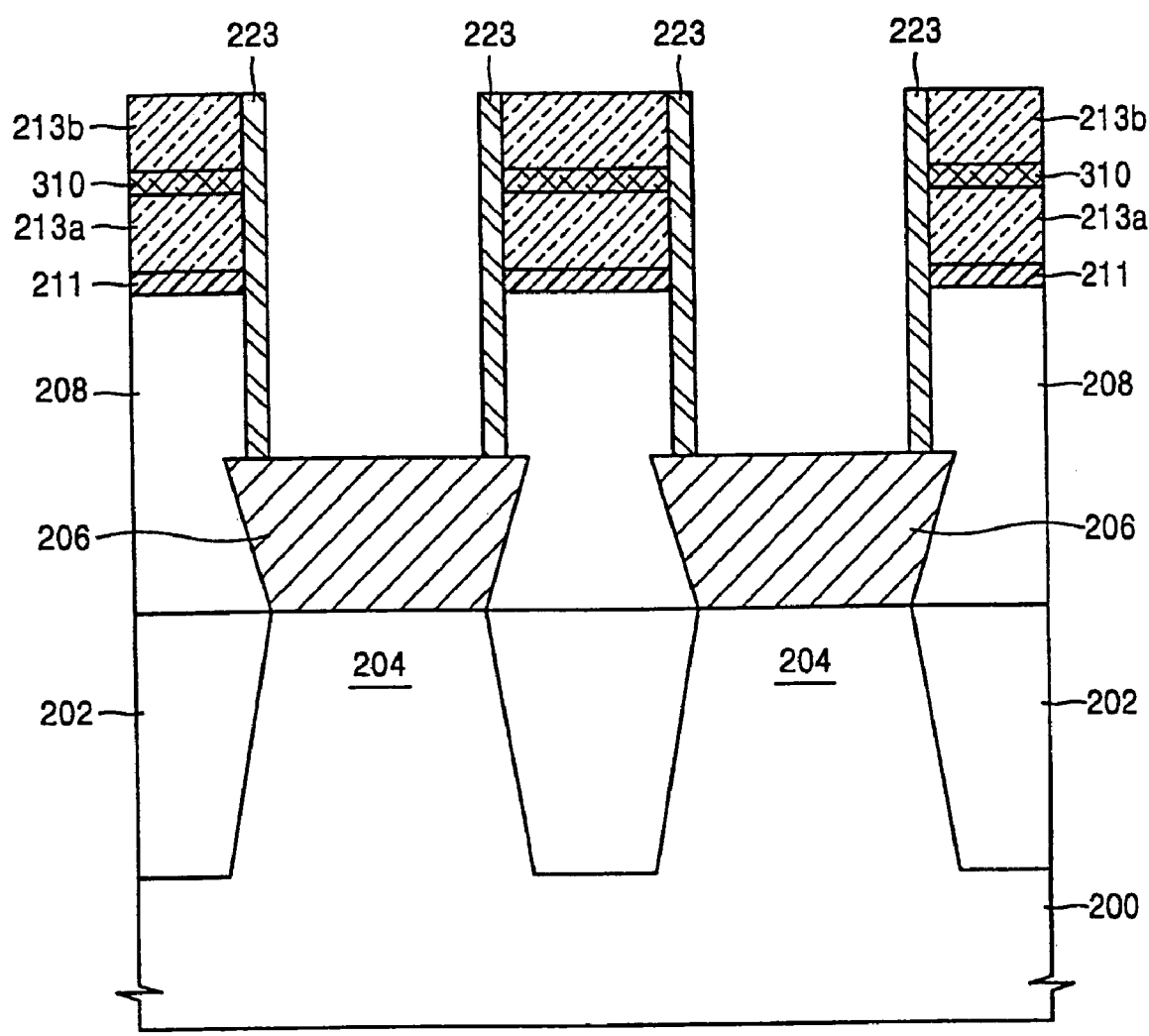

Next, as shown in FIG. 23, the first spacer insulating layer (see 222 of FIG. 22) is partly removed such that the upper surface of the second bit line conductive layer pattern 213b and the upper surface of the conductive layer pattern 206 are exposed. As a result, a first spacer layer 223 is formed. The first spacer layer 223 is arranged only on the side surfaces of the second bit line conductive layer pattern 213b, the barrier layer pattern 211 and the first insulating layer 208, is made. The formation of the first spacer layer 223 can be performed by etching-back the first spacer insulating layer (see 222 of FIG. 22).

Figure 24:
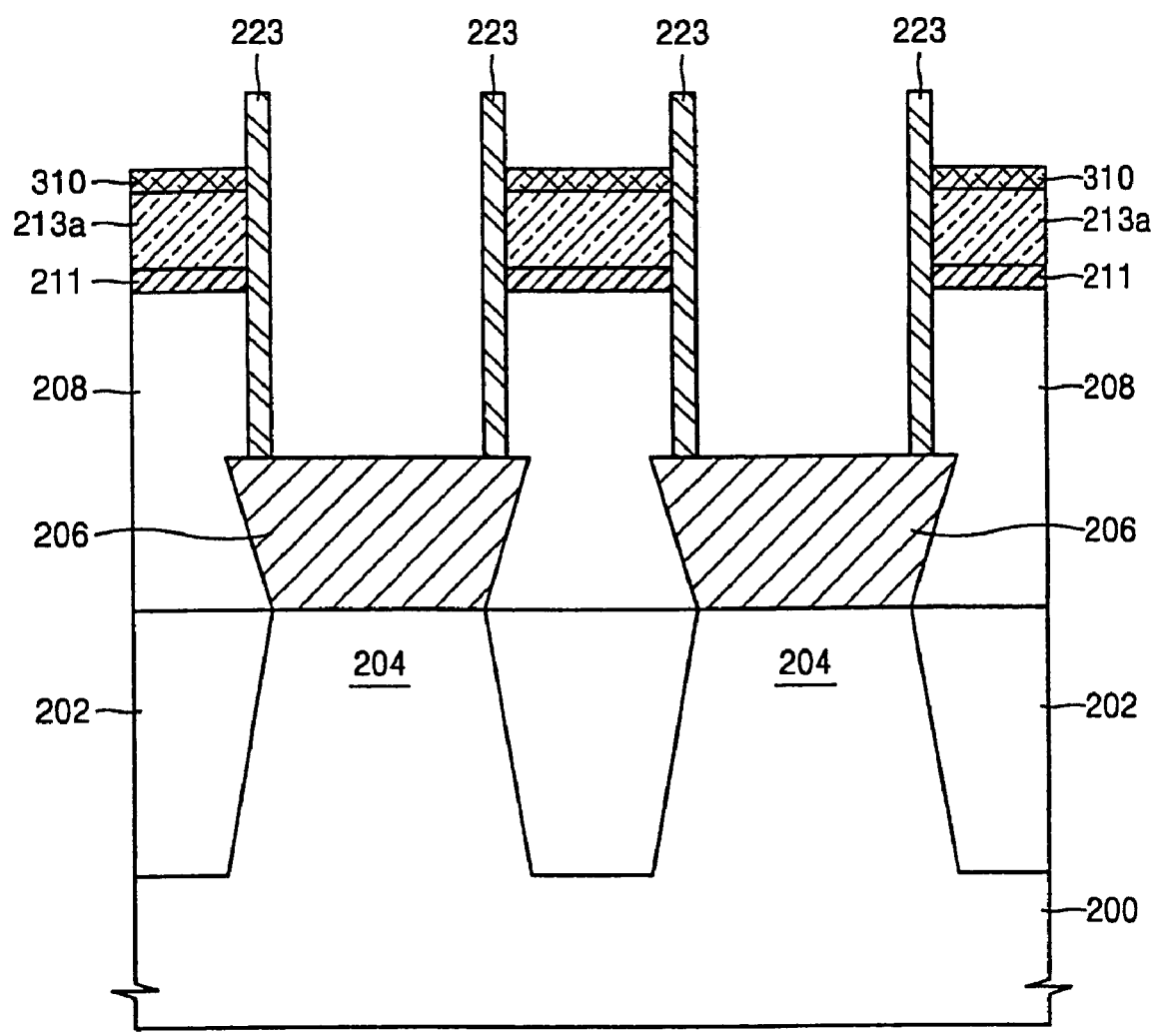

Next, as shown in FIG. 24, the second bit line conductive layer pattern 213b is removed. The removal of the second bit line conductive layer pattern 213b can be performed by an etch-back process. At this time, the end of the etching process in the above etch-back process is determined by the etch stopper layer pattern 310. As the second bit line conductive layer pattern 213b is partly removed, the etch stopper layer pattern 310 is exposed and the first spacer layer 223 has a shape protruded by the removed thickness of the second bit line conductive layer pattern 213b.

Figure 25:
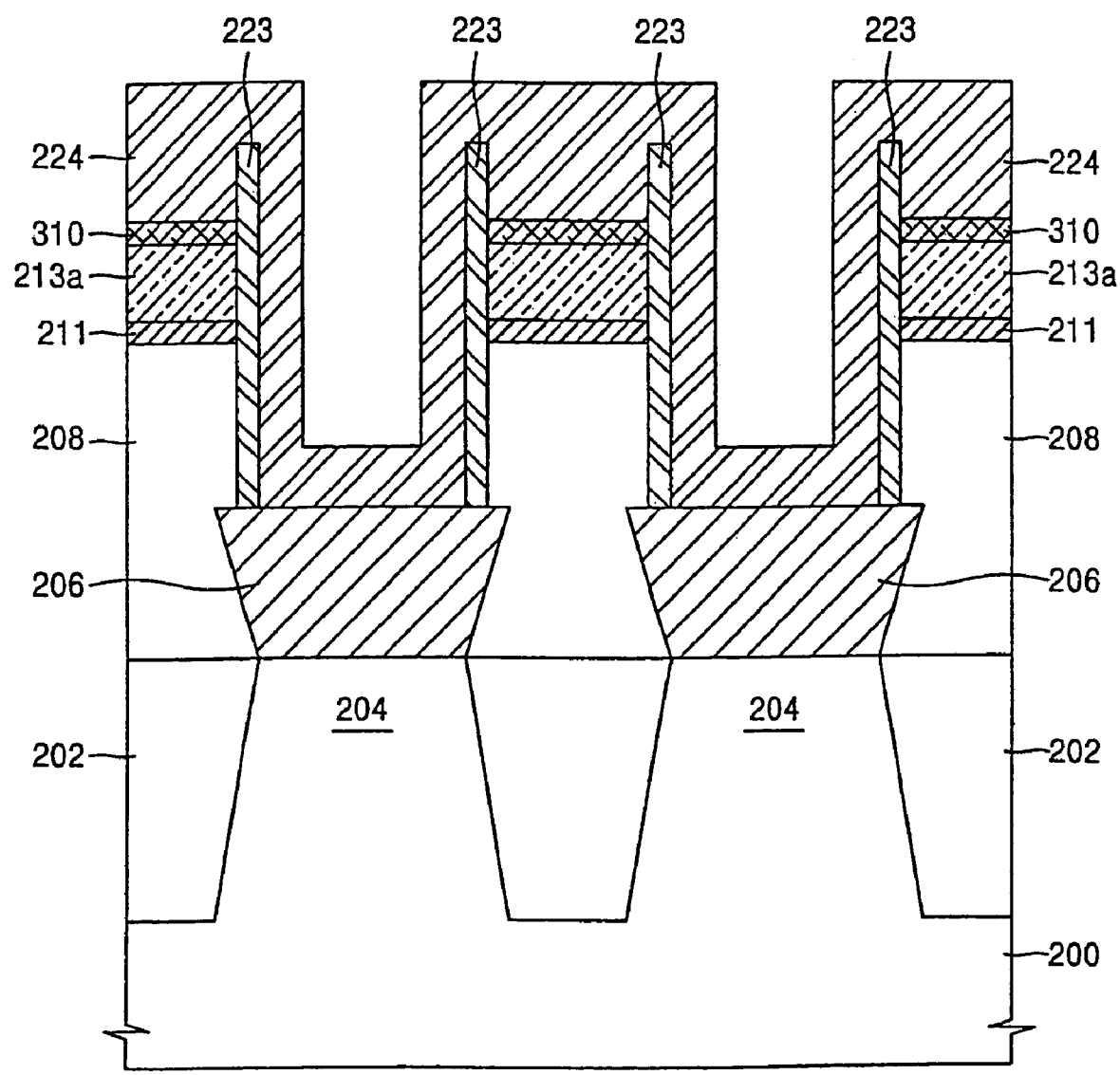

Next, as shown in FIG. 25, a second spacer insulating layer 224 is formed to cover the etch stopper layer pattern 310, the first spacer layer 223 and the conductive layer pad 206. The second spacer insulating layer 224 may be formed of silicon nitride. The second spacer layer 224 is formed having a sufficient thickness to substantially completely cover the first spacer layer 223.

Figure 26:
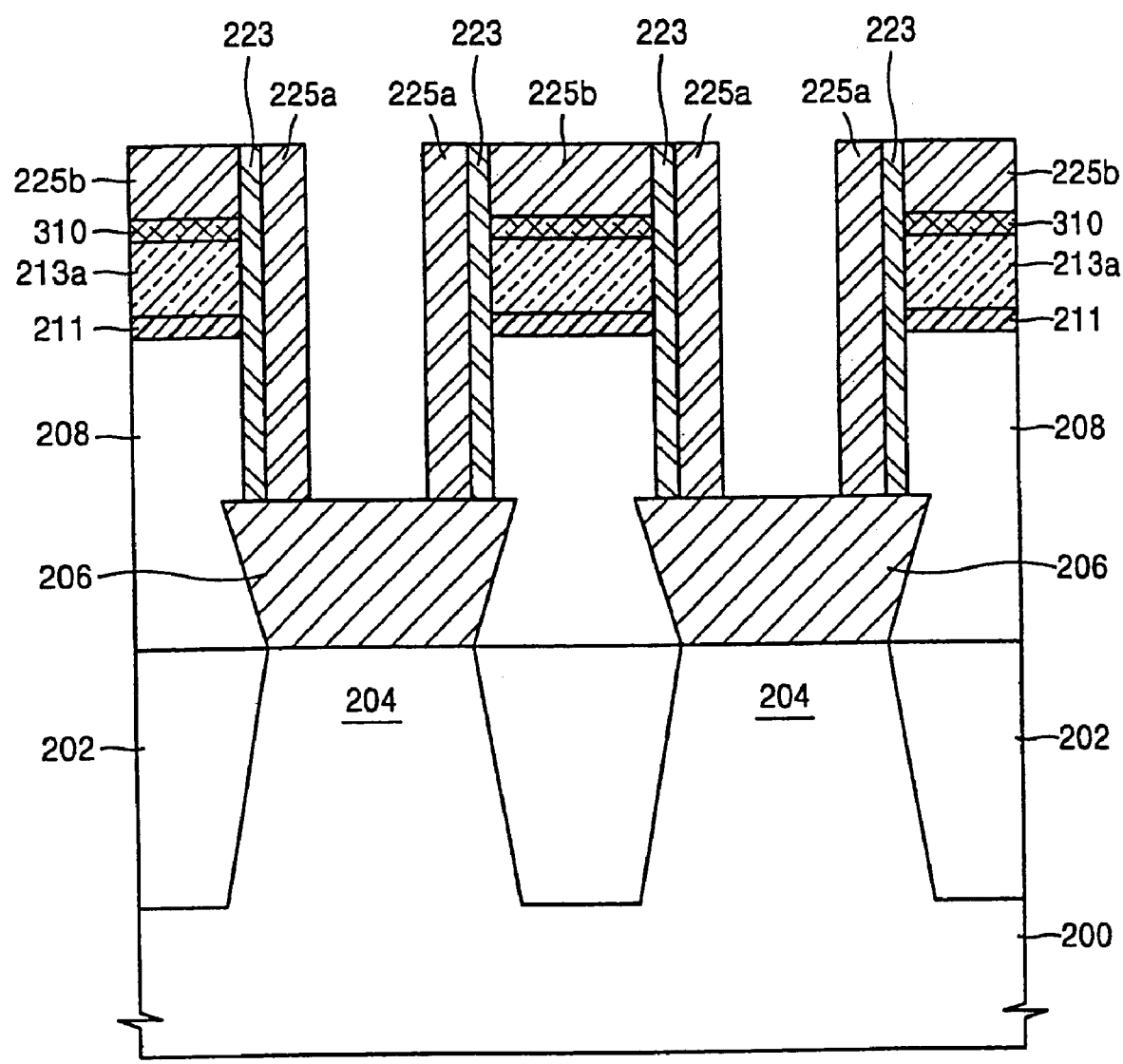

Next, as shown in FIG. 26, a part of the second spacer insulating layer (see 224 of FIG. 25) is removed such that an upper surface of the conductive layer pattern 206 is exposed. During this process, the first spacer layer 223 is also partly exposed. As a result, a second spacer layer 225a disposed on the side surface of the first spacer layer 223 and a second spacer insulating layer pattern 225b disposed on the upper surface of the etch stopper layer pattern 310 are formed. The second spacer layer 225a and the second spacer insulating layer pattern 225b can be formed by an etch-back process.

Figure 27:
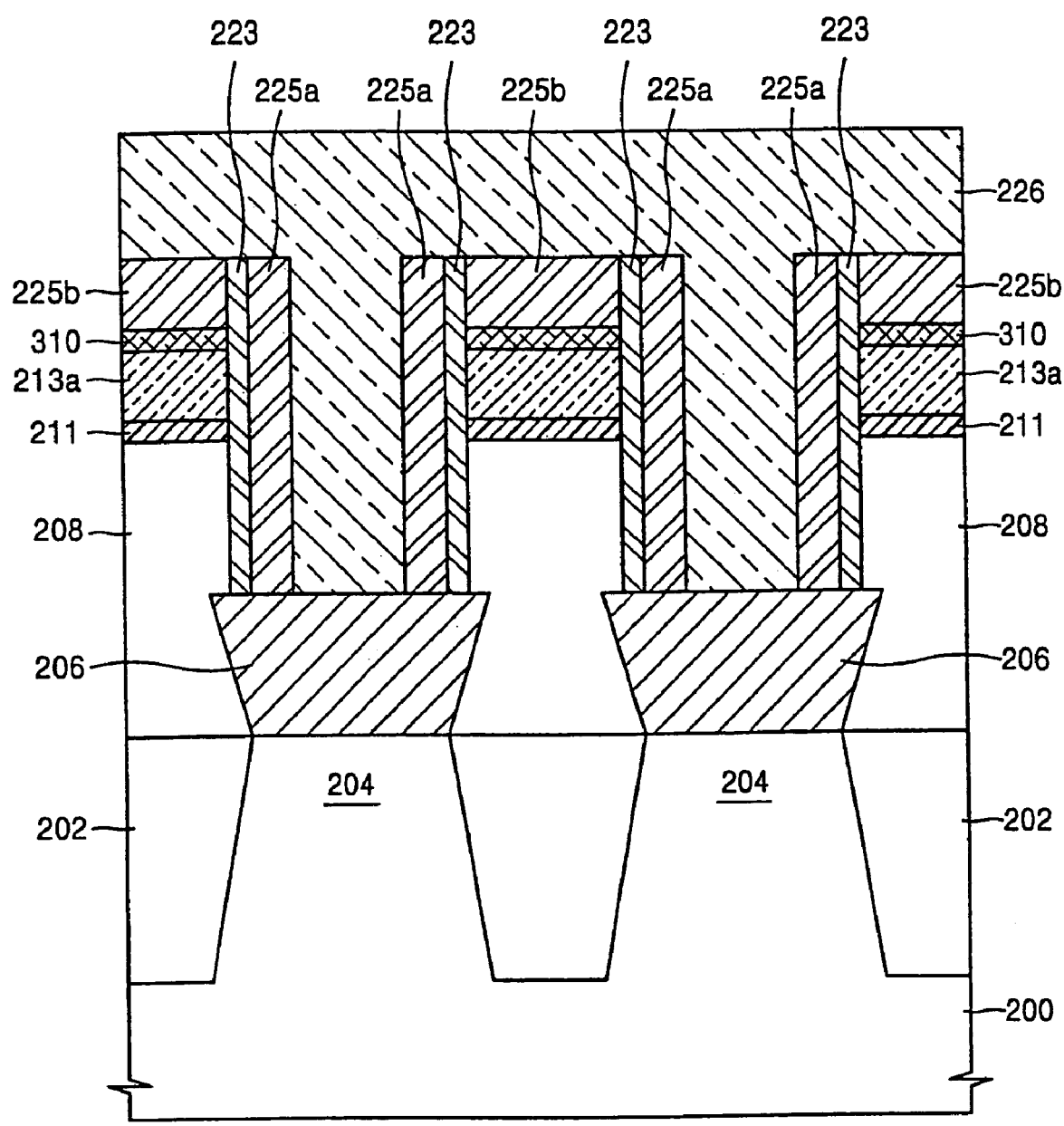

Next, as shown in FIG. 27, a conductive layer 226 for a buried contact is formed overlying the second spacer layer 225a and the second spacer insulating layer pattern 225b. The conductive layer 226 fills the inside of a contact hole formed by the second spacer layer 225a, and is accordingly in contact with the conductive layer pattern 206 inside the contact hole. The conductive layer 226 may be formed of polysilicon.

Figure 28:
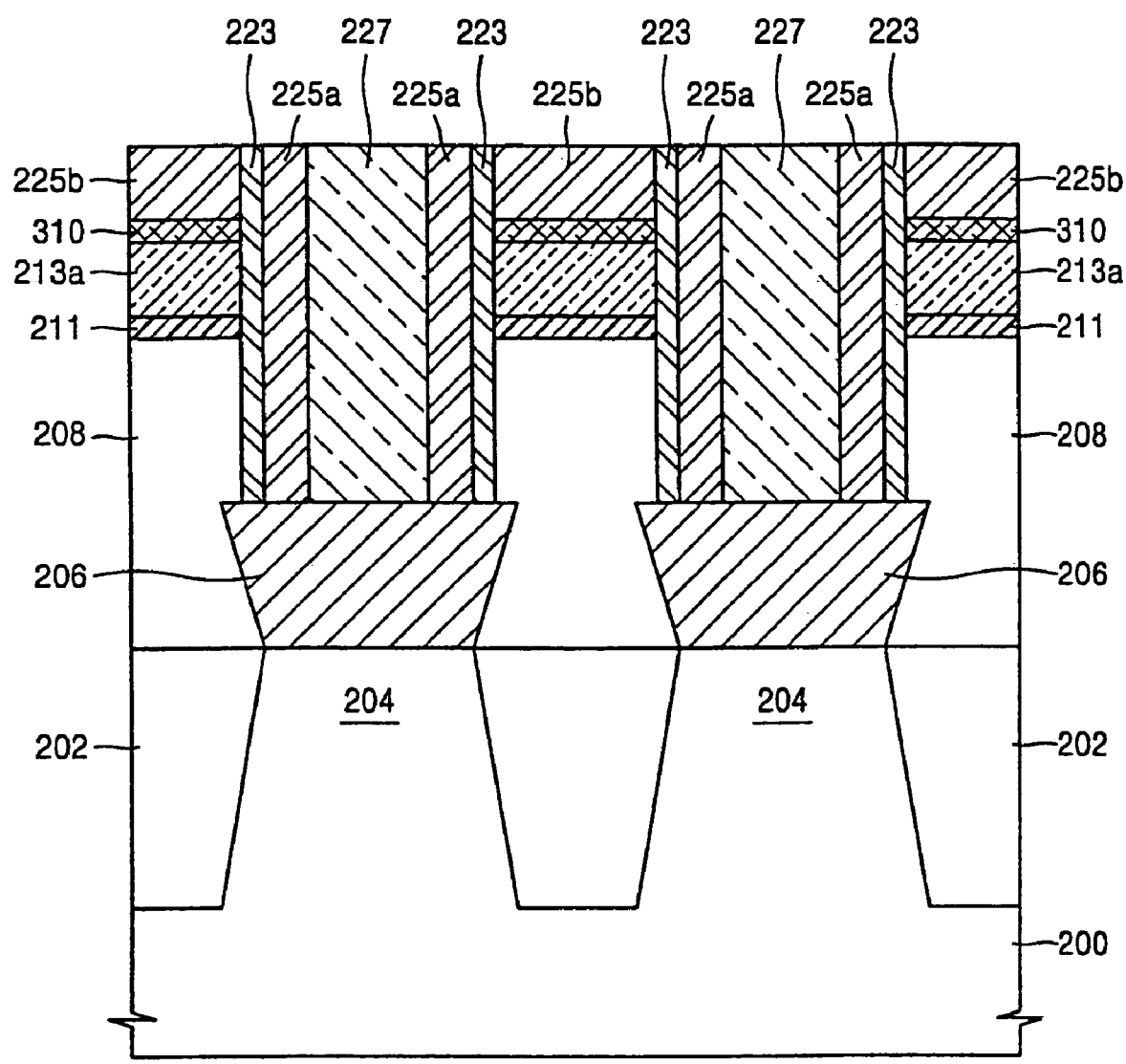

Next, as shown in FIG. 28, the conductive layer 226 is etched back such that the conductive layer 226 arranged on the upper surfaces of the second spacer insulating layer pattern 225b, the first spacer layer 223 and the second spacer layer 225a is removed. As a result, a conductive plug 227 filling only the contact hole defined by the second spacer layer 225a is made.

As described previously, according to an inventive method for manufacturing a semiconductor device, an insulating layer of an oxide layer is etched in a state where the bit line is exposed, and first and second spacer layers having a desired thickness are formed to define the contact area between the buried contact plug and the buried contact pad, so that the first and second spacer layers for insulating the bit line and the buried contact plug can be formed by a necessary thickness. In conclusion, the inventive method provides an advantage that the contact area between the buried contact plug and the buried contact pad is maximized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor memory device, the method comprising:
   forming a first insulating layer covering a conductive pad contacting an impurity region of a semiconductor substrate;
   sequentially forming a first bit line conductive layer, an etch stopper layer, a second bit line conductive layer and a second insulating layer on the first insulating layer;
   patterning the first bit line conductive layer, the etch stopper layer, the second bit line conductive layer and the second insulating layer to form a first bit line conductive layer pattern, an etch stopper layer pattern, a second bit line conductive layer pattern and a second insulating layer pattern that expose a part of the first insulating layer;
   forming a third insulating layer covering the exposed surfaces of the first insulating layer, the second bit line conductive layer pattern and the second insulating layer pattern;
   removing a part of the third insulating layer and the second insulating layer pattern to expose an upper surface of the second bit line conductive layer pattern and an upper surface of the third insulating layer;
   sequentially removing the exposed portion of the third insulating layer and a part of the first insulating layer to expose a portion of the conductive pad;
   forming a first spacer layer on side walls of the second bit line conductive layer pattern, the etch stopper layer pattern, the first bit line conductive layer pattern and the first insulating layer;
   removing an upper portion of the second bit line conductive layer pattern until a portion of the etch stopper layer pattern is exposed and an upper portion of the first spacer layer is protruded;
   respectively forming an insulating layer pattern on the etch stopper layer pattern and a second spacer layer on a side wall of the first spacer; and
   forming a conductive plug, which is in contact with the conductive pad between the second spacer layers.

2. The method of claim 1, wherein removing a part of the third insulating layer and the second insulating layer pattern comprises chemical mechanical polishing.

3. The method of claim 1, wherein the exposing of the conductive pad comprises:
   forming a stripe-shaped photoresist layer pattern crossing the second bit line conductive layer pattern such that a partial surface of the second bit line conductive layer pattern and a partial surface of the third insulating layer are exposed;
   performing an etch process, using the photoresist layer pattern as an etch mask, to remove the exposed portion of the third insulating layer such that the conductive pad beneath the third insulating layer is exposed; and
   removing the photoresist layer pattern.

4. The method of claim 3, wherein the third insulating layer is formed of a material layer having a high etching selectivity with respect to the second bit line conductive layer.

5. The method of claim 4, wherein the second bit line conductive layer comprise tungsten (W) and the third insulating layer comprise an oxide.

6. The method of claim 5, wherein the etch stopper layer comprises a nitride.

7. The method of claim 1, wherein the forming of the first spacer layer comprises:
   forming a first spacer insulating layer on an entire surface of a resultant semiconductor substrate where the conductive pad is exposed; and
   removing the first spacer insulating layer placed on the second bit line conductive layer pattern and the conductive pad to expose the upper surface of the second bit line conductive layer pattern and the upper surface of the conductive pad and to form the first spacer layer disposed on the side walls of the second bit line conductive layer pattern, the etch stopper layer, the second bit line conductive layer pattern and the first insulating layer.

8. The method of claim 7, wherein the first spacer insulating layer comprises nitride and the removal of the first spacer insulating layer comprises an etch-back process.

9. The method of claim 1, wherein the removal of the second bit line conductive layer pattern comprises an etch-back process.

10. The method of claim 1, wherein the forming of the insulating pattern and the second spacer layer comprises:
    forming a second spacer insulating layer on the resultant structure where the second bit line conductive layer pattern is removed; and
    removing a portion of the second spacer insulating layer to expose both the first spacer layer and the conductive pad and to form the insulating layer pattern on the etch stopper layer pattern and also the second spacer layer on the side wall of the first spacer layer.

* * * * *